(12) United States Patent
Banno et al.

(10) Patent No.: US 12,127,485 B2
(45) Date of Patent: Oct. 22, 2024

(54) SWITCHING ELEMENT AND METHOD FOR MANUFACTURING SAME

(71) Applicant: NANOBRIDGE SEMICONDUCTOR, INC., Tsukuba (JP)

(72) Inventors: Naoki Banno, Tsukuba (JP); Munehiro Tada, Tsukuba (JP); Hideaki Numata, Tsukuba (JP); Koichiro Okamoto, Tsukuba (JP)

(73) Assignee: NANOBRIDGE SEMICONDUCTOR, INC., Tsukuba (JP)

( * ) Notice: Subject to any disclaimer, the term of this patent is extended or adjusted under 35 U.S.C. 154(b) by 511 days.

(21) Appl. No.: 17/421,418

(22) PCT Filed: Jan. 7, 2020

(86) PCT No.: PCT/JP2020/000129
§ 371 (c)(1),
(2) Date: Jul. 8, 2021

(87) PCT Pub. No.: WO2020/145253
PCT Pub. Date: Jul. 16, 2020

(65) Prior Publication Data
US 2022/0123210 A1 Apr. 21, 2022

(30) Foreign Application Priority Data
Jan. 8, 2019 (JP) ................ 2019-001355

(51) Int. Cl.
*H01L 27/24* (2006.01)
*H10B 63/00* (2023.01)
*H10N 70/00* (2023.01)

(52) U.S. Cl.
CPC ........... *H10N 70/023* (2023.02); *H10B 63/30* (2023.02); *H10N 70/063* (2023.02); *H10N 70/8416* (2023.02); *H10N 70/883* (2023.02)

(58) Field of Classification Search
CPC ............. H10N 70/063; H10N 70/8416; H10N 70/883; H10N 70/023; H10N 70/24;
(Continued)

(56) References Cited

U.S. PATENT DOCUMENTS

| 6,487,106 B1 | 11/2002 | Kozicki |
| 2011/0272664 A1 | 11/2011 | Tada et al. |

(Continued)

FOREIGN PATENT DOCUMENTS

| JP | A 2002-536840 | 10/2002 |
| JP | B 5382001 | 1/2014 |

(Continued)

*Primary Examiner* — Shahed Ahmed
(74) *Attorney, Agent, or Firm* — Dority & Manning, P.A.

(57) ABSTRACT

A switching element that has reduced switching voltage and leakage current and that demonstrates high reliability and low power consumption is achieved as a result of comprising: a first insulation layer in which first wiring mainly consisting of copper is embedded in a first wiring groove that opens upward; a second insulation layer which is formed on an upper surface of the first insulation layer and the first wiring and has an opening that reaches the first insulation layer and the first wiring; a first electrode which is the portion of the first wiring that is exposed from the opening; an oxygen supply layer which is formed on an upper surface of the second insulation layer, generates oxygen plasma during etching to form the opening in the second insulation layer, and remains at least in the vicinity of the opening of the upper surface of the second insulation layer; an ion conducting layer which is formed on the upper surface of the first insulation layer and the first electrode that are exposed from the opening, an inner surface of the opening of the second insulation layer, and an upper surface of the oxygen supply layer; and a second electrode that is formed on an upper surface of the ion conducting layer.

6 Claims, 13 Drawing Sheets

(58) Field of Classification Search
CPC ............... H10N 70/826; H10N 70/882; H10N 70/20–8845; H10N 70/231–235; H10B 99/00; H10B 63/30; H10B 63/00–845; G11C 13/0011; G11C 13/0007–0019; G11C 5/06–10; H01L 27/105; H01L 2221/1015–1036
See application file for complete search history.

(56) References Cited

U.S. PATENT DOCUMENTS

| | | | |
|---|---|---|---|
| 2012/0097916 A1* | 4/2012 | Tada | H10N 70/826 257/4 |
| 2012/0280200 A1 | 11/2012 | Tada et al. | |
| 2013/0082231 A1 | 4/2013 | Tada et al. | |
| 2013/0181180 A1 | 7/2013 | Tada et al. | |
| 2015/0103583 A1 | 4/2015 | Tada et al. | |
| 2015/0155487 A1 | 6/2015 | Tada et al. | |
| 2016/0111638 A1* | 4/2016 | Banno | H10B 63/80 257/4 |
| 2016/0284993 A1 | 9/2016 | Tada et al. | |
| 2017/0162784 A1* | 6/2017 | Banno | H10N 70/8416 |

FOREIGN PATENT DOCUMENTS

| | | |
|---|---|---|
| JP | A 2015-111712 | 6/2015 |
| JP | B 6112106 | 4/2017 |
| JP | A 2017-107911 | 6/2017 |
| WO | WO 2011/158821 A1 | 12/2011 |
| WO | WO 2012/043502 A1 | 4/2012 |

* cited by examiner

FIG.2
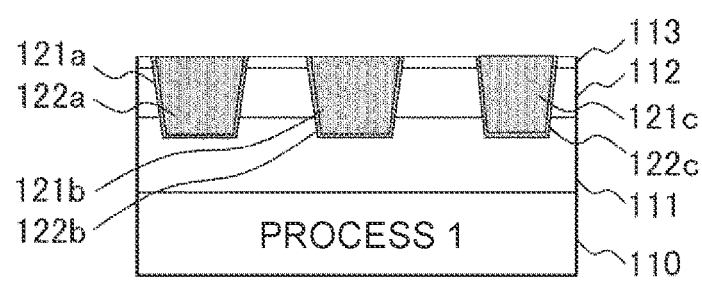
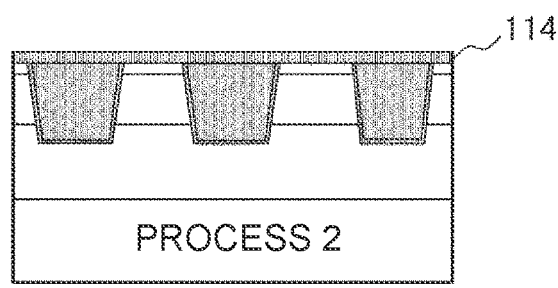
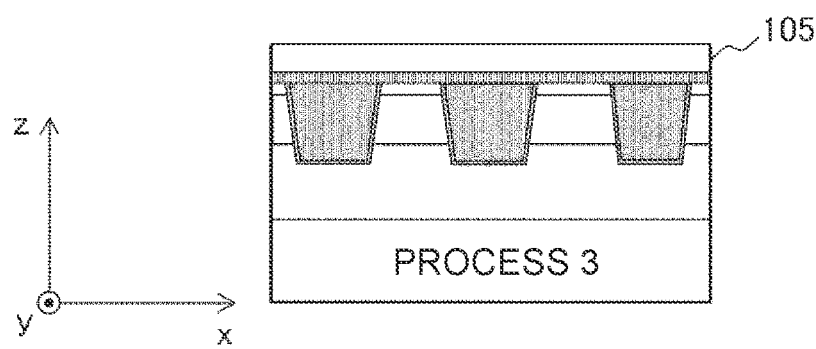
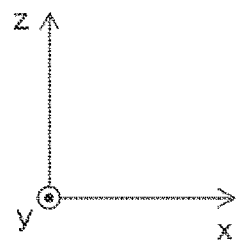

FIG.3
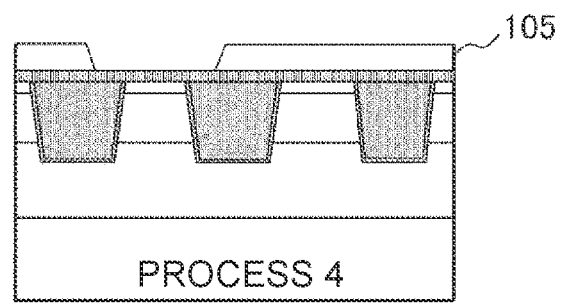
PROCESS 4
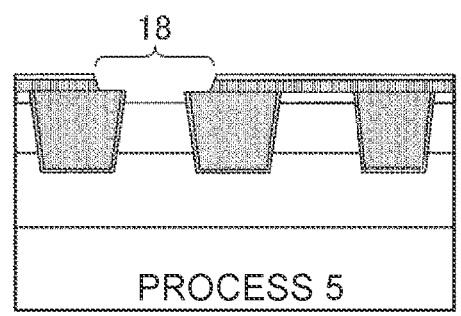
PROCESS 5
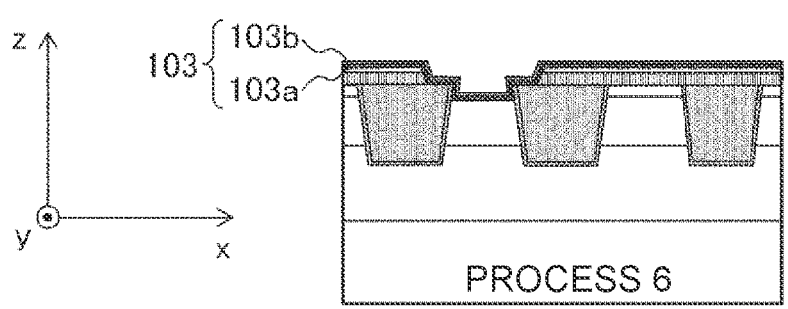
PROCESS 6

SWITCHING ELEMENT AND METHOD FOR MANUFACTURING SAME

CROSS-REFERENCE TO RELATED APPLICATIONS

The present application is a US national phase entry of International Patent Application No. PCT/JP2020/000129, filed Jan. 7, 2020, which, in turn, is based upon and claims the right of priority to Japanese Patent Application No. 2019-001355, filed Jan. 8, 2019, the disclosures of both of which are hereby incorporated by reference herein in their entirety for all purposes.

TECHNICAL FIELD

The present invention relates to a switching element that includes a variable resistance element, and to a method for manufacturing the same.

BACKGROUND ART

Decreasing the size of a switching element that connects logic cells together, and lowering the on resistance of the switching element, are required in order to diversify programmable logic functions and to advance packaging into electronic equipment and the like. Switching elements, which utilize precipitation of metal within an ion conducting layer, are smaller sized and have lower on resistance than general semiconductor switches, and therefore, the element size can be decreased.

Patent Document 1 discloses a two-terminal type switching element (hereinafter called two-terminal switch) that includes an ion conducting layer. The two-terminal switch of Patent Document 1 has a structure in which the ion conducting layer is sandwiched between a first electrode that supplies metal ions and a second electrode that does not supply metal ions. The two-terminal switch of Patent Document 1 can be switched by controlling the voltage that is applied between the both electrodes, and forming/extinguishing metal crosslinking at the interior of the ion conducting layer. Because the structure of the two-terminal switch is simple, the fabricating process is easy, and the element size can be processed to be small to the order of nanometers.

Patent Document 2 discloses a three-terminal type switching element (hereinafter called three-terminal switch). The three-terminal switch of Patent Document 2 has a structure in which the second electrodes of two two-terminal switches are made integral. High reliability can be ensured in accordance with the three-terminal switch of Patent Document 2.

Further, in order to package the switching element disclosed in Patent Document 1 or Patent Document 2 as a wire switching switch of a programmable logic, making the switching elements compact and high-density, and simplifying the manufacturing process, are required. Wires of cutting-edge semiconductor devices are copper wires whose main component is copper. Therefore, a method that utilizes copper wires and forms variable resistance elements efficiently is desired.

Patent Document 3 and Patent Document 4 disclose techniques of using a copper wire that is on a semiconductor substrate also as the first electrode of a switching element, and integrating the switching elements. By using the structure of the first electrode of Patent Document 3 and Patent Document 4, a process for newly forming a first electrode can be cut. Therefore, a mask for forming a first electrode is unnecessary, and it suffices for there to be two photomasks that are added at the time of manufacturing the variable resistance element, and the manufacturing cost can be decreased.

Patent Document 5 discloses a variable resistance element having a variable resistance film, a first electrode that is disposed as a wire on one surface of the variable resistance film and that has curved end portions, and a second electrode that is disposed as an inactive electrode on the other surface of the variable resistance film. The corner portions of the first electrode of the variable resistance element of Patent Document 5 are positioned at the curved end portions, and contact the variable resistance film that has been inserted into an opening formed in an insulating barrier film. In the variable resistance element of Patent Document 5, electric fields concentrate at the corner portions of the first electrode that are positioned at the end portions of the copper wire. If the amounts of the corner portions of the copper wire that are exposed from the opening of the insulating barrier film are increased, the electric field concentration region is enlarged, and therefore, switching is carried out at a region where it is easy for an electric field concentration to arise, and dispersion in switching voltages can be reduced.

Patent Document 6 discloses a variable resistance element of a structure in which an ion conducting layer is interposed between an upper electrode and a lower electrode. In the variable resistance element of Patent Document 6, a dug-down portion is formed at the surface of the lower electrode of the variable resistance element, and the ion conducting layer is formed so as to contact the dug-down portion of the surface of the lower electrode. In accordance with the variable resistance element of Patent Document 6, by forming a structure in which the copper electrode that contacts the ion conducting layer is dug-in downward in the vertical direction, the plasma damage that is inflicted on the element at the time of forming the via that is recessed toward the upper side of the element can be reduced.

PRIOR ART DOCUMENTS

Patent Documents

Patent Document 1: Japanese Patent Application National Publication No. 2002-536840
Patent Document 2: International Publication No. 2012/043502
Patent Document 3: International Publication No. 2011/158821
Patent Document 4: Japanese Patent No. 5382001
Patent Document 5: Japanese Patent No. 6112106
Patent Document 6: Japanese Patent Application Laid-Open No. 2017-107911

SUMMARY OF INVENTION

Technical Problem

The methods of manufacturing a switching element of Patent Documents 3 through 6 include a process of exposing the lower electrode at the opening of a barrier insulation layer. Therefore, there is the possibility that residue that comes from the etched barrier insulation layer will remain on the lower electrode. If residue that comes from the barrier insulation layer remains on the lower electrode, the film thickness of the ion conducting layer becomes apparently thick, and, due thereto, there is the possibility that the switching voltage will increase, and adhesion of the ion conducting layer and the lower electrode will deteriorate.

Residue components that come from the silicon (Si) and carbon (C) that are used in the barrier insulation layer can be removed by oxygen plasma that introduces oxygen gas into the etching at the time of forming an opening in the barrier insulation layer. In an element structure such as that of the semiconductor devices of Patent Documents 3 through 6, a Low-k layer is disposed in order to lower the dielectric constant, at other than the places of the edges of the copper wire. Because the oxygen plasma that is introduced from the exterior into the etching chamber has high physical energy, the oxygen plasma acts strongly not only on the residue of the lower electrode, but also on the Low-k layer as well. A Low-k layer has the tendency that, accompanying the decomposition of the C component due to the oxygen gas, the digging-in into the substrate in a vertically downward direction becomes marked, and the Low-k layer is dug-into by the oxygen plasma. In an element structure using the edges of the lower electrode, if the digging-in of the edges of the lower electrode is deep, the barrier metal of the lower electrode and the ion conducting layer become close, and it is easy for an electric field to concentrate at this place where they are close, and therefore, an increase in the switching voltage and a decrease in the dielectric breakdown voltage arise. Further, the oxygen plasma that has high physical energy oxidizes the surface of the lower electrode. As a result of these phenomena, in the semiconductor devices of Patent Documents 3 through 6, there is the tendency for it to be easy for the switching voltage and leakage current to increase.

In order to solve the above-described problems, an object of the present invention is to provide a switching element in which switching voltage and leakage current are reduced, and that is highly reliable, and at which the consumed electric power is low.

Solution to Problem

A switching element of an aspect of the present invention comprises: a first insulation layer at which a first wire, that has copper as a main component, is embedded in a first wiring groove that opens upward; a second insulation layer that is formed at upper surfaces of the first insulation layer and the first wire, and in which is formed an opening that extends to the first insulation layer and the first wire; a first electrode that is a portion, which is exposed from the opening, of the first wire; an oxygen supply layer that is formed at an upper surface of the second insulation layer, and that generates oxygen plasma at a time of etching that forms the opening in the second insulation layer, and that remains at, of an upper surface of the second insulation layer, at least a periphery of the opening; an ion conducting layer that is formed on upper surfaces of the first insulation layer and the first electrode that are exposed from the opening, and on inner side surfaces of the opening of the second insulation layer, and on an upper surface of the oxygen supply layer; and a second electrode that is formed at an upper surface of the ion conducting layer.

A method of manufacturing a switching element of an aspect of the present invention comprises: forming a second insulation layer at an upper surface of a first insulation layer at which a first wire, that has copper as a main component, is embedded in a first wiring groove that opens upward; forming an oxygen supply layer at upper surfaces of the second insulation layer and the first wire; patterning the oxygen supply layer; by carrying out dry etching by using the patterned oxygen supply layer as a hard mask, forming an opening, which extends to upper surfaces of the second insulation layer and the first wire, in the second insulation layer; removing residue on a surface of the first wire that is exposed from the opening by oxygen plasma generated by dry etching the oxygen supply layer; forming an ion conducting layer at upper surfaces of the first insulation layer and the first wire that are exposed from the opening, and at inner side surfaces of the opening of the second insulation layer, and at an upper surface of the oxygen supply layer; and forming a second electrode at an upper surface of the ion conducting layer.

Advantageous Effects of Invention

In accordance with the present invention, there can be provided a switching element in which switching voltage and leakage current are reduced, and that is highly reliable, and at which the consumed electric power is low.

BRIEF DESCRIPTION OF DRAWINGS

FIG. 2 is a schematic drawing for explaining manufacturing processes (processes 1 through 3) of the semiconductor device relating to the first embodiment of the present invention.

FIG. 3 is a schematic drawing for explaining manufacturing processes (processes 4 through 6) of the semiconductor device relating to the first embodiment of the present invention.

DESCRIPTION OF EMBODIMENTS

Figure 1:
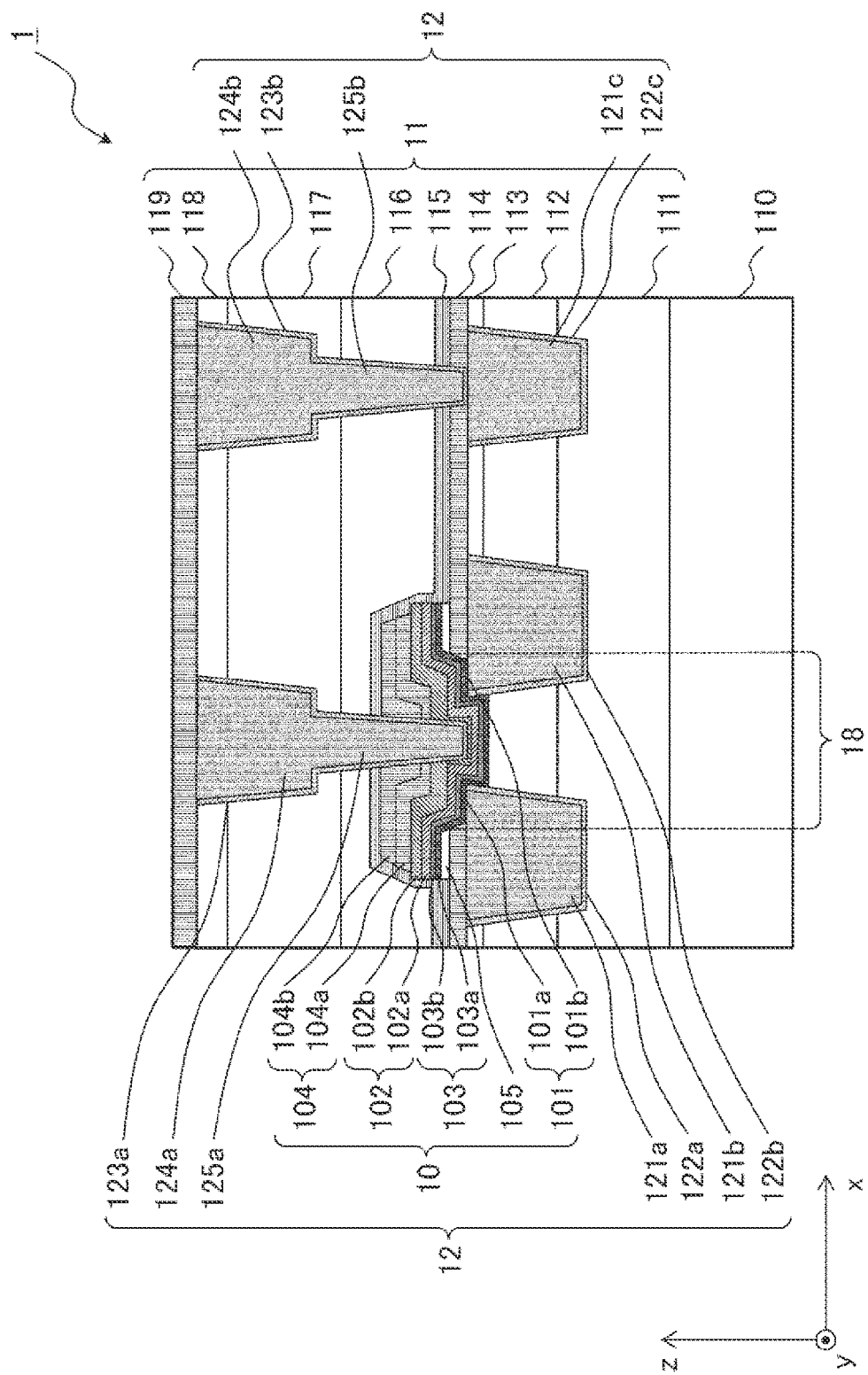
FIG. 1 is a schematic drawing showing an example of the structure of a semiconductor device relating to a first embodiment of the present invention.

Forms for embodying the present invention are described hereinafter by using the drawings. However, although limitations that are technically preferable for embodying the present invention are placed on the embodiments that are described hereinafter, the scope of the invention is not limited to the following. Note that, in all of the drawings that are used in describing the following embodiments, the same portions are denoted by the same reference numerals, unless there is a specific reason. Further, in the following embodiments, there are cases in which repeat explanation of structures/actions that are similar is omitted.

First Embodiment

First, a semiconductor device relating to a first embodiment of the present invention is described with reference to the drawings. The semiconductor device of the present embodiment has a structure that includes a three-terminal type switching element (also called three-terminal switch) at the interior of a multilayer wiring layer that is formed on a substrate. Note that the semiconductor device of the present embodiment is a schematic structure for explaining characteristic points of the present embodiment, and the scale and shapes and the like are not expressed accurately.

FIG. 1 is a cross-sectional view showing an example of the structure of a semiconductor device 1 of the present embodiment. As in FIG. 1, the semiconductor device 1 has a substrate 110, a switching element 10, an insulating layered body 11, and a multilayer wiring layer 12. In the following description, there are cases in which letters are appended to the reference numerals denoting the structural elements, in order to differentiate between the individual structural elements. Further, letters for differentiating between the respective structural elements may be omitted in cases of not differentiating between individual structural elements.

The substrate 110 is a substrate on which a semiconductor element is formed. For example, a substrate such as a silicon substrate, a single crystal substrate, an SOI (Silicon on Insulator) substrate, a TFT (Thin Film Transistor) substrate, a substrate for liquid crystal manufacturing, or the like can be used as the substrate 110. The switching element 10, the insulating layered body 11, and the multi layer wiring layer 12 are formed above the substrate 110.

The switching element 10 is a three-terminal switch that is formed at the interior of the insulating layered body 11. The switching element 10 shares some structural components with the multilayer wiring layer 12. The switching element 10 has a first electrode 101, a second electrode 102, an ion conducting layer 103, a hard mask layer 104, and an oxygen supply layer 105. The first electrode 101 includes a first electrode 101a and a first electrode 101b. The second electrode 102 includes a lower second electrode 102a and an upper second electrode 102b. The ion conducting layer 103 includes a first ion conducting layer 103a and a second ion conducting layer 103b. The hard mask layer 104 includes a first hard mask layer 104a and a second hard mask layer 104b.

The switching element 10 is a three-terminal switch that includes a first variable resistance element and a second variable resistance element. The first variable resistance element is structured by the first electrode 101a, the first ion conducting layer 103a, the second ion conducting layer 103b, the lower second electrode 102a, and the upper second electrode 102b. The second variable resistance element is structured by the first electrode 101b, the first ion conducting layer 103a, the second ion conducting layer 103b, the lower second electrode 102a, and the upper second electrode 102b.

The insulating layered body 11 is a layered body of insulation layers at which the switching element 10 and the multilayer wiring layer 12 are formed. The insulating layered body 11 has a structure in which an interlayer insulation layer 111, a Low-k layer 112, an interlayer insulation layer 113, a barrier insulation layer 114, a protecting insulation layer 115, an interlayer insulation layer 116, a Low-k layer 117, an interlayer insulation layer 118, and a barrier insulation layer 119 are layered in that order. The interlayer insulation layer 111, the Low-k layer 112, and the interlayer insulation layer 113 correspond to a first insulation layer. The barrier insulation layer 114 corresponds to a second insulation layer. The interlayer insulation layer 6, the Low-k layer 117 and the interlayer insulation layer 118 correspond to a third insulation layer.

The multilayer wiring layer 12 is a wiring layer that is formed at the interior of the insulating layered body 11. The multilayer wiring layer 12 is structured by a first wire 121, a first barrier metal 122, a second barrier metal 123, a second wire 124, and a via 125. The portion of the first wire 121 which portion contacts the ion conducting layer 103 is the first electrode 101. The first wire 121 includes a first wire 121a, a first wire 121b and a first wire 121c. The first barrier metal 122 includes a first barrier metal 122a, a first barrier metal 122b and a first barrier metal 122c. The second barrier metal 123 includes a second barrier metal 123a and a second barrier metal 123b. The second wire 124 includes a second wire 124a and a second wire 124b. The via 125 includes a via 125a and a via 125b.

An opening 18 is formed in the barrier insulation layer 114. The Low-k layer 112 is exposed at the bottommost surface of the opening 18, between the first electrode 101a and the first electrode 101b. The opening 18 is formed so as to be tapered toward the depth direction (the −Z direction). The inner side surfaces of the opening 18 that is formed in the barrier insulation layer 14 are tapered surfaces that are tapered toward the depth direction.

Details of the switching element 10, the insulating layered body 11 and the multilayer wiring layer 12 will be individually described hereinafter.

[Switching Element]

First, the switching element 10 is described with reference to FIG. 1. The switching element 10 is structured by the first electrode 101, the second electrode 102, the ion conducting layer 103, the hard mask layer 104, and the oxygen supply layer 105. Note that the hard mask layer 104 may be considered to be a structure of the insulating layered body 11, and not a structure of the switching element 10.

[First Electrode]

The first electrode 101 is an active electrode. The first electrode 101 is a portion of the first wire 121 that is one layer of the multilayer wiring layer 12 that is formed on the substrate 110. Of the first wire 121, the upper surface portion, which is exposed from the opening 18 of the barrier insulation layer 114 and is covered by the ion conducting; layer 103, structures the first electrode 101. Of the first wire 121, the upper surface portion that is not exposed from the opening 18 is covered by the barrier insulation layer 114. The switching element 10 of FIG. 1 is a three-terminal switch in which the two first electrodes 101 (the first electrode 101a, the first electrode 101b) correspond to the one second electrode 102.

A metal that can diffuse or that can conduct ions at the ion conducting layer 13 is used at the first electrode 101. For example, a metal whose main component is copper is used at the first electrode 101. Further, the first electrode 101 may be structured by an alloy of aluminum and copper.

[Second Electrode]

The second electrode 102 is an inactive electrode. The second electrode 102 is formed on the upper surface of the ion conducting layer 103. The side surfaces of the second electrode 102 and the upper surface of the peripheral edge portions thereof are covered by the protecting insulation layer 115. The second electrode 102 includes the lower second electrode 102a and the upper second electrode 102b.

The lower second electrode 102a is formed on the upper surface of the ion conducting layer 103. The upper second electrode 102b is formed on the upper surface of the lower second electrode 102a. The side surfaces of the lower second electrode 102a are covered by the protecting insulation layer 115.

The lower second electrode 102a is the electrode at the lower layer side of the upper electrode of the switching element 10, and, at the lower surface thereof, contacts the second ion conducting layer 103b. An alloy containing a metal, which is more difficult to ionize than the metal that structures the first wire 121 and which has difficulty diffusing or conducting ions at the second ion conducting layer 103b, and a metal, which has good adhesion to the metal that structures the first wire 121, is used at the lower second electrode 102a. For example, ruthenium is an example of a metal that is more difficult to ionize than the metal that structures the first wire 121 and that has difficulty diffusing or conducting ions at the second ion conducting layer 103b. For example, titanium, tantalum, zirconium, hafnium, aluminum or the like are examples of metals that have good adhesion to the metal that structures the first wire 121. In particular, it is preferably to use a ruthenium alloy at the lower second electrode 102a.

In a case in which the lower second electrode 102a is structured of a ruthenium alloy, it is preferable to select a metal, whose standard generated Gibbs energy in the process of being oxidized (also called the oxidation process) is larger in the negative direction than that of ruthenium, as the added metal that is added to the ruthenium. Titanium, tantalum, zirconium, hafnium and aluminum whose standard generated Gibbs energy in the oxidation process is larger in the negative direction than that of ruthenium, exhibit the characteristic that it is easy for a chemical reaction to spontaneously occur as compared with ruthenium, and therefore, the reactivity thereof is high. Thus, in the ruthenium alloy that structures the lower second electrode 102a, the adhesion to the metal crosslinking that is formed by the metal that structures the first wire 121a and the first wire 121b improves.

On the other hand, if the lower second electrode 102a is structured only by the added metal such as titanium, tantalum, zirconium, hafnium, aluminum or the like and does not contain ruthenium, the reactivity thereof is high, and therefore, the switching element 10 does not transition to the off state. The transition from the on state to the off state advances due to the oxidation reaction (the lytic reaction) of the metal that structures the metal crosslinking. If the standard generated Gibbs energy in the oxidation process of the metal that structures the lower second electrode 102a is greater in the negative direction than that of the metal that structures the first electrode 101, the oxidation reaction of the lower second electrode 102a progresses more than the oxidation reaction of the metal cross link that is formed by the metal that structures the first wire 121. Therefore, the switching element 10 cannot transition to the off state.

Namely, the metal material that is used in forming the lower second electrode 102a must be an alloy of ruthenium whose standard generated Gibbs energy in the oxidation process is smaller in the negative direction than that of copper. Moreover, if a component (copper) of the metal crosslinking is mixed into the lower second electrode 102a, the effect of adding the metal whose standard Gibbs energy is large in the negative direction weakens. Therefore, the metal that is added to the ruthenium is preferably a material that has a barrier property with respect to copper and copper ions. For example, tantalum and titanium and the like have a barrier ability with respect to copper and copper ions. On the other hand, the greater the amount of the added metal, the more the on state of the switching element 10 is stabilized. Even if there is addition of around 5 atom percent of the added metal, the stability of the on state of the switching element 10 improves. In particular, a case in which the added metal is made to be titanium is excellent for the transition to the off state and for the stability of the on state In particular, it is preferable to hake the lower second electrode 102a be an alloy of ruthenium and titanium, and to have the titanium percentage content be in the range of 20 to 30 atom percent. The percentage content of the ruthenium in this ruthenium alloy is desirably greater than or equal to 60 atom percent and less than or equal to 90 atom percent.

The lower second electrode 102a is formed by using a sputtering method. For example, a method using an alloy target of ruthenium and the added metal, and a co-sputtering, method that sputters a ruthenium target and a target of the added metal simultaneously within the same chamber, are examples of methods that form a film of the alloy by using a sputtering method. Further, for example, an intermixing method, in which a thin film of the added metal is formed in advance, and a ruthenium film is formed thereon by using a sputtering method, and an alloy is formed by the energy of the colliding atoms, is an example of a method of forming a film of the alloy by using a sputtering method. If a co-sputtering method or an intermixing method is used, the composition of the alloy can be adjusted. At the time of employing an intermixing method, in order to standardize the mixed state, it is preferable to add a heat treatment of 400° C. or less after the ruthenium film formation is completed.

The upper second electrode 102b is the electrode at the upper layer side of the upper electrode of the switching element 10, and is formed on the upper surface of the lower second electrode 102a. The side surfaces and the upper surface of the peripheral edge portions of the upper second electrode 102b are covered by the protecting insulation layer 115.

The upper second electrode 102b has the function of protecting the lower second electrode 102a. Due to the upper second electrode 102b protecting the lower second electrode 102a, damage to the lower second electrode 102a in the process of manufacturing the semiconductor device 1 is suppressed, and the switching characteristics of the switching element 10 can be maintained.

For example, tantalum, titanium or tungsten, or nitrides thereof or the like, can be used at the upper second electrode 102b. Further, at the time of electrically connecting the via 125a onto the lower second electrode 102a, the upper second electrode 102b functions as an etching stop layer as well. Therefore, it is preferable that the upper second electrode 102b be structured of a material whose etching speed is low as compared with that of the plasma of a fluorocarbon gas that is used in etching the interlayer insulation layer 116.

For example, the upper second electrode 102b functions as an etching stop layer, and is preferably structured by a nitride of titanium, tantalum, zirconium, hafnium, aluminum or the like that is electrically conductive. If a metal that is not a nitride is used at the upper second electrode 102b, there are cases in which, due to heating or plasma damage during processing, some of the metal that structures the upper second electrode 102b will diffuse into the interior of the lower second electrode 102a. If some of the metal that structures the upper second electrode 102b diffuses into the interior of the lower second electrode 102a, defects arise within the lower second electrode 102a, and there is the possibility that the dielectric breakdown voltage of the ion conducting layer 103 will be lowered, originating from these detects. By using a metal nitride that is stable and electrically conductive at the upper second electrode 102b, diffusion of the metal into the lower second electrode 102a can be prevented. If the metal of the nitride that structures the upper second electrode 102b, and the added metal that forms an alloy with ruthenium and structures the lower second electrode 102a, are made to be the same, the problem of diffusion of the metal that forms the alloy with ruthenium can be prevented more efficiently.

For example, in a case in which the lower second electrode 102a is an alloy electrode of ruthenium and titanium, it is preferable that the upper second electrode 102b be made to be a titanium nitride electrode. Further, in a case in which the lower second electrode 102a is an alloy of ruthenium and tantalum, it is preferable that the upper second electrode 102b be to be a tantalum nitride electrode. If the metal components that structure the lower second electrode 102a and the upper second electrode 102b are made to match, it is difficult for defects to form even if the metal of the upper second electrode 102b diffuses into the lower second electrode 102a. At this time, it is preferable to form a structure such that the proportion of the metal with respect to the nitrogen of the nitride that structures the upper second electrode 102b is made to be greater than the proportion of the metal with respect to the ruthenium in the ruthenium alloy that structures the lower second electrode 102a. By forming a structure in this way, it is difficult for the metal that structures the lower second electrode 102a to diffuse into the nitride that structures the upper second electrode 102b, and therefore, the composition of the ruthenium alloy that structures the lower second electrode 102a can be prevented from varying. Concretely, it is more preferable for the percentage content of titanium to be greater than or equal to 60 atom percent and less than or equal to 80 atom percent.

For example, the upper second electrode 102b can be formed by using a sputtering method. If a film of a metal nitride is formed by using a sputtering method, it is preferable to use a reactive sputtering method that evaporates the metal target by using plasma of a mixed gas of nitrogen and argon. The metal that is evaporated from the metal target reacts with the nitrogen, and becomes a metal nitride and is formed into a film.

[Ion Conducting Layer]

The ion conducting layer 103 is formed along the upper surface of the oxygen supply layer 105, the inner side surfaces of the opening 18 of the barrier insulation layer 114 and the oxygen supply layer 105, the upper surface of the first electrode 101, portions of the upper surface and the side surfaces of the first barrier metal 122, and a portion of the upper surface of the Low-k layer 112. The second electrode 102 is formed at the upper surface of the ion conducting layer 103.

The ion conducting layer 103 is a film whose electrical resistance varies due to voltage being applied between the first electrode 101 and the second electrode 102. A material whose electrical resistance varies due to an action such as the diffusion of or the ion conduction of or the like of ons that are generated from the metal structures the first wire 121a and the first wire 121b, can be used at the ion conducting layer 103. For example, in a case in which varying of the resistance of the switching element 10 that accompanies switching to the on state is carried out by the precipitating of the metal due to the reduction of metal ions, a film that can conduct ions is used at the ion conducting layer 103. The ion conducting layer 103 includes the first ion conducting layer 103a and the second ion conducting layer 103b.

The first ion conducting layer 103a is formed along the upper surface of the oxygen supply layer 105, the inner side surfaces of the opening 18 of the barrier insulation layer 114 and the oxygen supply layer 105, the upper surface of the first electrode 101, portions of the upper surface and the side surfaces of the first barrier metal 122, and a portion of the upper surface of the Low-k layer 112. The second ion conducting layer 103b is formed on the upper surface of the first ion conducting layer 103a.

The first ion conducting layer 103a prevents the metal that structures the first wire 121a and the first wire 121b from diffusing into the interior of the second ion conducting layer 103b due to the heating or plasma during the time of accumulating the second ion conducting layer 103b. Further, the first ion conducting layer 103a prevents the first wire 121a and the first wire 121b from being oxidized and it becoming easy for the structural metals of the first wire 121a and the first wire 121b to diffuse into the second ion conducting layer 103b.

For example, the first ion conducting layer 103a can be structured by an oxide of a metal such as zirconium, hafnium, indium, lanthanum, manganese, molybdenum, niobium, tungsten, titanium, aluminum or the like. These metal oxides can be formed stably without giving rise to an interface reaction with the first electrode 101a, the first electrode 101b, the second ion conducting layer 103b and the lower second electrode 102a, and can effectively suppress moisture absorption of the second ion conducting layer 103b. These oxides also have good compatibility with general semiconductor manufacturing processes.

For example, the first ion conducting layer 103a can be formed by forming a film of a metal for structuring the first ion conducting layer 103a, and, thereafter, exposing and oxidizing the film in an oxygen atmosphere under reduced pressure within a film forming chamber of the second ion conducting layer 103b. The optimal film thickness of the metal film that structures the first ion conducting layer 103a is 0.5 to 1 nanometers. The metal film that is used in forming the first ion conducting layer 103a may be formed by layering layers or may be a single layer. The first ion conducting layer 103a can be formed as a film by sputtering. The metal atoms or ions that obtain energy due to sputtering dash into and diffuse into the first wire 121a and the first wire 121b and form an alloy layer.

The second ion conducting layer 103b is formed on the upper surface of the first ion conducting layer 103a. The lower second electrode 102a is formed on the upper surface of the second ion conducting layer 103b. The second ion conducting layer 103b can be structured by a material including at least one of tantalum Ta, nickel Ni, titanium Ti, zirconium Zr, hafnium Hf, silicon Si, aluminum Al, iron Fe, vanadium V, manganese Mn, cobalt Co and tungsten W. A metal oxide film that includes these elements, a low dielectric constant carbon-doped silicon oxide film (SiOCH film), a chalcogenide film, or a layered film of these or the like can be used at the second ion conducting layer 103b.

The second ion conducting layer 103b can be formed by using a plasma CVD (Chemical Vapor Deposition) method. For example, at the time of forming the second ion conducting layer 103b by a plasma CVD method, a cyclic organic siloxane raw material and helium that is a carrier gas are made to flow into a reaction chamber, and the supply of both is stabilized. Then, at the time when the pressure of the reaction chamber becomes constant, application of RF (Radio Frequency) power is started. For example, the raw material of the second ion conducting layer 103b is supplied at 10 to 200 sccm (Standard Cubic Centimeter per Minute), and the helium is supplied through a raw material vaporizer at 500 sccm.

[Hard Mask Layer]

The hard mask layer 104 is formed above the ion conducting layer 103. The hard mask layer 104 is a mask that is used at the time of manufacturing the switching element 10. The hard mask layer 104 includes the first hard mask layer 104a and the second hard mask layer 104b.

The hard mask layer 104 is a film that also serves as a hard mask film and a passivation film at the time of etching the lower second electrode 102a, the upper second electrode 102b, the first ion conducting layer 103a and the second ion conducting layer 103b. For example, a silicon nitride film or a silicon oxide film or layers thereof or the like can be used at the hard mask layer 104. The hard mask layer 104 preferably contains the same material as the barrier insulation layer 114 and the protecting insulation layer 115. If the hard mask layer 104, the barrier insulation layer 114 and the protecting insulation layer 115 are structured of the same material, the entire periphery of the switching element 10 can be surrounded by the same material, and therefore, the interfaces of the materials can be made integral. If the interfaces of the materials are made integral, penetration of moisture and the like from the exterior can be prevented, and desorption from the switching element 10 can be prevented.

The first hard mask layer 104a is formed on the upper surface of the upper second electrode 102b. The first hard mask layer 104a is preferably the same material as the protecting insulation layer 115 and the barrier insulation layer 114. By surrounding the entire periphery of the switching element 10 by a same material and making the material interfaces integral, penetration of moisture and the like from the exterior can be prevented, and desorption from the switching element 10 itself can be prevented.

The film of the first hard mask layer 104a can be formed by using a plasma CVD method. For example, if a mixed gas of silane and nitrogen is set in a highly-dense plasma state and is evaporated, a high-density silicon nitride film can be formed.

The second hard mask layer 104b is formed on the upper surface of the first hard mask layer 104a. The second hard mask layer 104b is preferably a film of a different type than the first hard mask layer 104a. For example, the first hard mask layer 104a is made to be a silicon nitride film, and the second hard mask layer 104b is made to be a silicon oxide film.

In the same way as the first hard mask layer 104a, a film of the second hard mask layer 104b can be formed by using a plasma CVD method. Note that the second hard mask layer 104b may be completely removed in the etching, and is not an essential structural element of the semiconductor device 1.

[Oxygen Supply Layer]

The oxygen supply layer 105 is formed on the upper surface of the barrier insulation layer 114. The opening 18 is formed in the oxygen supply layer 105. The first ion conducting layer 103a of the ion conducting layer 103 is formed on the upper surface of the oxygen supply layer 105 and the inner side surfaces of the opening 18. Namely, the oxygen supply layer 105 is interposed between the upper surface of the barrier insulation layer 114 and the lower surface of the first ion conducting layer 103a. Note that the first ion conducting layer 103a is disposed at the opening 18 of the barrier insulation layer 114, but the oxygen supply layer 105 is not disposed thereat.

The oxygen supply layer 105 has the role of supplying oxygen at the time when the opening 18 of the barrier insulation layer 114 is formed. The oxygen supply layer 105 may also serve as a hard mask at the time of forming the opening 18 of the barrier insulation layer 114. The oxygen supply layer 105 may be completely removed at the time when the lower second electrode 102a and the upper second electrode 120b are etched, but may remain between the barrier insulation layer 114 and the protecting insulation layer 115.

Further, the oxygen supply layer 105 may be extended onto the barrier insulation layer 114. If the oxygen supply layer 105 is extended onto the barrier insulation layer 114, the film thickness that is interposed between the protecting insulation layer 115 and the barrier insulation layer 114 is smaller than the film thickness that is interposed between the ion conducting layer 103 and the barrier insulation layer 114. Further, if the oxygen supply layer 105 is extended onto the barrier insulation layer 114, because the second ion conducting layer 103b and the oxygen supply layer 105 are both oxides, the adhesion is greater than between the second ion conducting layer 103b and the barrier insulation layer 114.

The oxygen supply layer 105 is structured of a material that includes at least silicon (Si) and oxygen (O). For example, silicon dioxide ($SiO_2$) is made to be the material of the oxygen supply layer 105. Further, the oxygen supply layer 105 may include carbon (C), hydrogen (H), nitrogen (N). For example, SiCO, SiOC, SiO, SiCOH, SiON, or the like is made to be the material of the oxygen supply layer 105.

The layer thickness of the oxygen supply layer 105 is preferably less than or equal to 20 nanometers. In particular, it is preferable that the step that makes the barrier insulation layer 114 and the oxygen supply layer 105 match be made to be less than or equal to 20 nanometers.

The oxygen supply layer 105 generates oxygen gas at the time of the etching that forms the opening 18 in the barrier insulation layer 114. At the time of the etching that forms the opening 18 in the barrier insulation layer 114, residue components, which come from the silicon (Si) and the carbon (C) that are used in the barrier insulation layer 114, remain on the upper surfaces of the first wire 121a and the first wire 121b. The residue components that remain on the upper surfaces of the first wire 121a and the first wire 121b are oxidized by the oxygen gas that is generated from the oxygen supply layer 105, and are removed.

In a general method, the residue components that remain on the upper surfaces of the first wire 121a and the first wire 121b are etched by introducing electrolyzed oxygen (oxygen plasma) into the interior of the etching chamber from the exterior, Because oxygen plasma has high physical energy, it acts strongly on the Low-k layer 112 as well, in addition to on the residue on the upper surfaces of the first wire 121a and the first wire 121b. Therefore, in a general method using oxygen plasma, the Low-k layer 112 is dug-in deeply.

On the other hand, in the present embodiment, instead of etching by introducing oxygen gas in from the exterior of the etching chamber, etching is carried out by using oxygen gas that is generated from the oxygen supply layer 105. In accordance with the method of the present embodiment, oxygen is supplied from the oxygen supply layer 105 that is in the vicinity of the opening 18 of the barrier insulation layer 114. The oxygen that is supplied from the oxygen supply layer 105 is plasma that has low energy, and acts selectively on the etching residue that has low binding energy, and therefore, the action on the Low-k layer 112 is weak. Therefore, in accordance with the method of the present embodiment, digging-in of the Low-k layer 112 is shallow as compared with in a general method.

Further, in a case of using a general method and carrying out etching by introducing oxygen gas, the surfaces of the first wire 121a and the first wire 121b are oxidized by the oxygen plasma that has high energy. Therefore, the switching voltage becomes apparently high due to the effects of the copper oxide that has low electrical conductivity. Further, because it is easy for copper ions to diffuse within copper oxide, leakage current increases.

On the other hand, in a case of carrying out etching by using the oxygen supply layer 105 as in the present embodiment, because oxygen plasma that has low energy is used, oxidation of the surfaces of the first wire 121a and the first wire 121b can be suppressed. Therefore, an increase in the switching voltage and in leakage current can be suppressed.

The above has been a description of the structure of the switching element 10. Note that the above-described structure of the switching element 10 is an example, and the structure of the switching element 10 of the present embodiment is not limited to that form as is.

[Insulating Layered Body]

The insulating layered body 11 is described next with reference to FIG. 1. The insulating layered body 11 is structured by the interlayer insulation layer 111, the Low-k layer 112, the interlayer insulation layer 113, the barrier insulation layer 114, the protecting insulation layer 115, the interlayer insulation layer 116, the Low-k layer 117, the interlayer insulation layer 118, and the barrier insulation layer 119. Note that the hard mask layer 104 may be considered to be a structure of the insulating layered body 11.

The interlayer insulation layer 111 (also called first interlayer insulation layer) is an insulating film that is formed on the upper surface of the substrate 110. For example, a silicon oxide film (SiO film) or a carbon-doped silicon oxide film (SiOC film) or the like can be used at the interlayering insulation layer 111. The interlayer insulation layer 111 may be a layer in which plural insulating films are layered.

The Low-k layer 112 (also called first low dielectric constant interlayer insulation layer) is formed between the interlayer insulation layer 111 and the interlayer insulation layer 113. The Low-k layer 112 is a low dielectric constant film whose relative dielectric constant is lower than that of a silicon oxide film. For example, a low dielectric constant carbon-doped silicon oxide (SiOCH) or the like can be used at the Low-k layer 112.

The interlayer insulation layer 113 (also called second interlayer insulation layer) is an insulating film that is formed on the upper surface of the Low-k layer 112. For example, a material that contains silicon oxide such as silicon monoxide (SiO) or silicon dioxide ($SiO_2$) or the like can be used at the interlayer insulation layer 113. Further, a layer that contains carbon-doped silicon oxide (SiOC), oxygen-doped silicon carbide (SiCO), low dielectric constant carbon-doped silicon oxide (SiCOH), silicon oxynitride (SiON) or the like can be used at the interlayer insulation layer 113. The interlayer insulation layer 113 may be a layer in which plural insulating films are layered.

Plural wiring grooves (hereinafter also called first wiring grooves) are formed in the Low-k layer 112 and the interlayer insulation layer 113. The plural first wiring grooves reach as far as the upper portion of the interlayer insulation layer 111. The first barrier metal 122 is formed at e respective inner surfaces of the plural #first wiring grooves, and the first wires are embedded therein via the first barrier metal 122. In the example of FIG. 1, three of the first wiring grooves are formed, and the first barrier metal 122a, the first barrier metal 122b and the first barrier metal 122c are formed at the inner surfaces of the respective first wiring grooves. Further, the first wire 121a, the first wire 121b and the first wire 121c are respectively embedded in the respective first wiring grooves in which the first barrier metal 122a, the first barrier metal 122b and the first barrier metal 122c are formed.

The barrier insulation layer 114 (also called first barrier insulation layer) is formed on the upper surface of the interlayer insulation layer 113 in which the first wires 121 are embedded. The barrier insulation layer 114 is an insulating film that prevents oxidation of the metal that structures the first wires 121, and that prevents diffusion of the structural metal of the first wires 121 into the interior of the interlayer insulation layer 116. Further, the barrier insulation layer 114 functions as an etching stop layer at the time of processing the second electrode 102 and the ion conducting layer 103. For example, silicon carbide (SiC), silicon carbonitride (SiCN), silicon nitride (SiN), or structures in which these are layered can be used at the barrier insulation layer 114. It is preferable that the barrier insulation layer 114 be the same material as the protecting insulation layer 115 and the hard mask layer 104 (the first hard mask layer 104a).

The opening 18 is formed in the barrier insulation layer 114. The opening 18 has tapered surfaces that are formed in tapered shapes that narrow toward the depth direction (the −Z direction). The switching element 10 is structured in a vicinity of the opening 18 of the barrier insulation layer 114. At the open region of the opening 18, portions of the upper surfaces and the side surfaces of the first electrode 101a, the first electrode 101b, the Low-k layer 112, the first barrier metal 122a and the first barrier metal 122b are exposed. The switching element 10 is structured by the layered structure of the first electrode 101a, the first electrode 101b, the lower second electrode 102a, the upper second electrode 102b, the first ion conducting layer 103a, the second ion conducting layer 103b, the first hard mask layer 104a and the second hard mask layer 104b. The switching element 10 is covered by the protecting insulation layer 115, Note that the protecting insulation layer 115 may be included in the structure of the switching element 10.

The respective first electrode 101a and first electrode 101b, and the first ion conducting layer 103, directly contact one another at the open region of the opening 18 formed in the barrier insulation layer 114. The metal that structures the first ion conducting layer 103a diffuses into the first electrode 101a and the first electrode 101b, and forms an alloy layer.

At the open region of the opening 18 that is formed in the barrier insulation layer 114, the upper second electrode 102b is electrically connected to the via 125a and the second wire 124a via the second barrier metal 123a. The on/off of the switching element 10 can be controlled by applying voltage or causing current to flow. For example, the on/off of the switching element 10 can be controlled by using interface diffusion of the metal ions that are supplied to the first ion conducting layer 103a and the second ion conducting layer 103b from the metal that structures the first wire 121a and the first wire 121b. Note that the first wire 121c and the via 125b are electrically connected via the second barrier metal 123b, without going through the switching element 10.

At the open region of the opening 18 formed in the barrier insulation layer 114, the interlayer insulation layer 113 that is sandwiched by the first wire 121a and the first wire 121b is dug-down, and the Low-k layer 112 is exposed. Namely, at the open region of the opening 18 of the barrier insulation layer 114, the ion conducting layer 103 has a region whose height differs in two stages. The first ion conducting layer 103a contacts the upper surfaces of the first electrode 101a and the first electrode 101b. Further, the first ion conducting layer 103a contacts portions of the upper surfaces and the side surfaces of the first barrier metal 122a and the first barrier metal 122b. Further, the first ion conducting layer 103a contacts the upper surface of the Low-k layer 112.

The protecting insulation layer 115 (also called protecting insulation layer) is an insulating film that has the function of protecting the switching element 10 at the time of manufacturing the semiconductor device 1, and the function of preventing oxygen from desorbing from the second ion conducting layer 103b. For example, a silicon nitride film or a silicon carbonitride film or the like can be used at the protecting insulation layer 115. It is preferable that the protecting insulation layer 115 be structured of the same material as the hard mask layer 104 and the barrier insulation layer 114. If the protecting insulation layer 115 is structured of the same material as the hard mask layer 104 and the barrier insulation layer 114, the protecting insulation layer 115, the hard mask layer 104 and the barrier insulation layer 114 are made integral, and the adhesion of the interfaces improves, and the switching element 10 can be protected more securely.

The interlayer insulation layer 116 (also called third interlayer insulation layer) is an insulating film that is formed on the upper surface of the protecting insulation layer 115. For example, a silicon oxide film or a carbon-doped silicon oxide film or the like can be used at the interlayer insulation layer 116. The interlayer insulation layer 6 may be a layer in which plural insulating films are layered. The interlayer insulation layer 116 may be made to be the same material as the interlayer insulation layer 118.

The Low-k layer 117 (also called second low dielectric constant interlayer insulation layer) is formed between the interlayer insulation layer 116 and the interlayer insulation layer 118. The Low-K layer 117 is a low dielectric constant film whose relative dielectric constant is lower than that of a silicon oxide film. For example, an SiOCH film or the like can be used at the Low-k layer 117.

The interlayer insulation layer 118 (also called fourth interlayer insulation layer) is an insulating film that is formed on the upper surface of the Low-k layer 117. For example, a silicon oxide film, an SiOC film, a low dielectric constant film whose relative dielectric constant is lower than that of a silicon oxide film, or the like can be used at the interlayer insulation layer 118. For example, an SiOCH film can be used at the interlayer insulation layer 118. The interlayer insulation layer 118 may be a layer in which plural insulating films are layered. Further, the interlayer insulation layer 118 may be made to be the same material as the interlayer insulation layer 116.

Plural holes for embedding the second wires 124 and the vias 125 are formed in the interlayer insulation layer 116, the Low-k layer 117 and the interlayer insulation layer 118. The lower ends of the holes that are formed in the interlayer insulation layer 116, the Low-k layer 117 and the interlayer insulation layer 118 extend to the level of the upper surfaces of the first electrodes 101 and the interlayer insulation layer 113. In the example of FIG. 1, the lower end of the hole in which the second wire 124a and the via 125a are embedded extends to the upper second electrode 102b. Further, the lower end of the hole in which the second wire 124b and the via 125b are embedded extends to the upper surface of the first wire 121c.

The second barrier metal 123 is formed at the respective inner surfaces of the plural holes formed in the interlayer insulation layer 116, the layer 117 and the interlayer insulation layer 118. The holes that are formed in the interlayer insulation layer 116, the Low-k layer 117 and the interlayer insulation layer 118 include a lower hole (lower side) in which the via 125 is embedded, and a second wiring groove (upper side) in which the second wire 124 is embedded.

From beneath the Low-k layer 117, the lower hole passes-through the interlayer insulation layer 116, the protecting insulation layer 115 and the barrier insulation layer 114, and extends to the level of the upper surfaces of the first electrode 101 and the interlayer insulation layer 113. In the example of FIG. 1, the lower end of the lower hole in which the via 125a is embedded extends to the upper second electrode 102b. Further, the lower end of the lower hole in which the via 125b is embedded extends to the upper surface of the first wire 121c. The vias 125 are embedded via the second barrier metal 123 in the interiors of the plural lower holes.

From beneath the Low-k layer 117, the second wiring groove passes-through the interlayer insulation layer 118, and extends to the level of the lower surface of the barrier insulation layer 119. In the example of FIG. 1, the upper ends of the second wiring grooves in which the second wire 124a and the second wire 124b are embedded extend to the barrier insulation layer 119. The second wires 124 are embedded via the second barrier metal 123 in the interiors of the plural second wiring grooves.

The barrier insulation layer 119 (also called second barrier insulation layer) is formed on the upper surface of the interlayer insulation layer 116 in which the second wires 124 are embedded. The barrier insulation layer 119 is an insulating film that prevents oxidation of the metal that structures the second wires 124, and prevents diffusion of the structural metal of the second wires 124 into the upper layers. For example, a silicon carbonitride film, a silicon carbide film, layered structures thereof, or the like can be used at the barrier insulation layer 119.

The above has been a description of the structure of the insulating layered body 11. Note that the above-described structure of the insulating layered body 11 is an example, and the structure of the insulating layered body 11 of the present embodiment is not limited to that form as is.

[Multilayer Wiring Layer]

The multilayer wiring layer 12 is described next with reference to FIG. 1. The multilayer wiring layer 12 is structured by the first wires 121, the first barrier metal 122, the second barrier metal 123, the second wires 124 and the vias 125.

The first wire 121 is a wire that is embedded, via the first barrier metal 122, in the first wiring groove that is formed in the interlayer insulation layer 113 and the Low-k layer 112.

The first wires 121 include the first wire 121a, the first wire 121b, and the first wire 121c.

The first wire 121a and the first wire 121b also serve as lower electrodes of the switching element 10. Portions of the upper surfaces of the first wire 121a and the first wire 121b contact the first ion conducting layer 103a. Of the upper surfaces of the first wire 121a and the first wire 121b, the portions that contact the first ion conducting layer 103a are the first electrode 101a and the first electrode 101b.

By making portions of the first wire 121a and the first wire 121b be the lower electrodes (the first electrode 101a and the first electrode 101b) of the switching element 10, the electrode resistance can be lowered while simplifying the number of processes. In accordance with the method of the present embodiment, the switching element 10 can be formed merely by preparing a PR (Photo Resist) mask set, as a process that is added to a usual copper damascene wiring process. Namely, in accordance with the structure of the present embodiment, a lowering of the resistance of the element and a lowering of costs can be achieved simultaneously.

A metal that can diffuse or that can conduct ions at the ion conducting layer 103 is used as the metal that structures the first wire 121a and the first wire 121b. For example, a metal that contains copper can be used at the first wire 121a and the first wire 121b. In a case in which the first wire 121a and the first wire 121b contain copper, they may be made into an alloy with aluminum.

An alloy layer with the metal that structures the first ion conducting layer 103a is formed at the interfaces of the first wire 121a and the first wire 121b, and the first ion conducting layer 103a. Note that the alloy layer is not formed at the entire first wire 121a and first wire 121b, and is formed at the first electrode 101a and the first electrode 101b that are positioned at the opening 18 of the barrier insulation layer 114.

The first wire 121c is electrically connected to the via 125b and the second wire 124b via the second barrier metal 123b, at the opening of the barrier insulation layer 114. In the same way as the first wire 121a and the first wire 121b, a metal that contains copper can be used at the first wire 121c. In a case in which the first wire 121c contains copper, it may be made into an alloy with aluminum.

The first barrier metal 122 is an electrically conductive film that has a barrier property and is formed at the inner side of the first wiring groove that is formed in the Low-k layer 112 and the interlayer insulation layer 113. The first barrier metal 122 covers the side surfaces and the bottom surfaces of the first wires 121. The first barrier metal 122 prevents the metal that structures the first wires 121 from diffusing into the lower layers that are the interlayer insulation layer 113, the Low-k layer 112 and the interlayer insulation layer 111. For example, in a case in which copper is the main component of the first wire 121, high melting point metals and nitrides thereof and the like such as tantalum, tantalum nitride, titanium nitride and tungsten carbonitride, and layered films thereof can be used at the first barrier metal 122. The first barrier metal 122 includes the first barrier metal 122a, the first barrier metal 122b, and the first barrier metal 122c.

The second barrier metal 123 is an electrically conductive film that has a barrier property and is formed at the inner side of the second wiring groove that is formed in the barrier insulation layer 114, the protecting insulation layer 115, the interlayer insulation layer 116, the Low-k layer 117, and the interlayer insulation layer 118. The second barrier metal 123 covers the side surfaces and the bottom surfaces of the vias 125, and covers portions of the side surfaces and the bottom surfaces of the second wires 124. The second barrier metal 123 prevents the metals that structure the second wires 124 and the vias 125 from diffusing into the interlayer insulation layer 116, the Low-k layer 117, the interlayer insulation layer 118, and the like. For example, in a case in which the vias 125 and the second wires 124 are metal elements whose main component is copper, a high melting point metal and nitrides thereof and the like such as tantalum, tantalum nitride, titanium nitride and tungsten carbonitride, and layered films thereof can be used at the second barrier metal 123. Further, it is preferable that the second barrier metal 123 be the same material as the upper second electrode 102b. For example, in a case in which the second barrier metal 123 is structured as a layered structure of tantalum nitride (the lower layer) and tantalum (the upper layer), it is preferable to use tantalum nitride, which is the material of the lower layer of the second barrier metal 123, at the upper second electrode 102b. The second barrier metal 123 includes the second barrier metal 123a, and a second barrier metal 123c.

The second wire 124 is a wire that that is embedded, via the second barrier metal 123, in the second wiring groove that is formed in the interlayer insulation layer 118 and the Low-k layer 117. The second wire 124 is formed integrally with the 125. For example, the second wire 124 can be structured by a metal such as copper or the like. The second wires 124 include the second wire 124a and the second wire 124b.

The second wire 124a is a conductor that is formed integrally with the via 125a. The second wire 124a is a wire that is embedded, via the second barrier metal 123a, in the second wiring groove that is formed in the interlayer insulation layer 118 and the Low-k layer 117. The second wire 124a is electrically connected to the upper second electrode 102b via the via 125a and the second barrier metal 123a.

The second wire 124b is a conductor that is formed integrally with the via 125b. The second wire 124ba is a wire that is embedded, via the second barrier metal 123b, in the second wiring groove that is formed in the interlayer insulation layer 118 and the Low-k layer 117. The second wire 124b is electrically connected to the first wire 121c via the via 125b and the second barrier metal 123b.

The via 125 is a conductor that is embedded, via the second barrier metal 123, in the lower hole that is formed through the barrier insulation layer 114, the protecting insulation layer 115, the interlayer insulation layer 116 and the Low-k layer 117. The via 125 is a conductor that is formed integrally with the second wire 124. For example, the via 125 can be structured by a metal such as copper or the like. The via 125 includes the via 125a and the via 125b.

The via 125a is embedded, via the second barrier metal 123a, in the lower hole that is formed so as to pass-through the hard mask layer 104, the protecting insulation layer 115 and the interlayer insulation layer 116. The via 125a is electrically connected to the upper second electrode 102b via the second barrier metal 123a.

The via 125b is embedded, via the second barrier metal 123b, in the lower hole that is formed so as to pass-through the barrier insulation layer 114, the protecting insulation layer 115, and the interlayer insulation layer 116. The via 125b is electrically connected to the first wire 121c via the second barrier metal 123b.

The above has been a description of the structure of the multilayer wiring layer 12. Note that the above-described structure of the multilayer wiring layer 12 is an example, and the structure of the multilayer wiring layer 12 of the present embodiment is not limited to that form as is.

The above has been a description of the structure of the semiconductor device 1. Note that the above-described structure of the semiconductor device 1 is an example, and the structure of the semiconductor device 1 of the present embodiment is not limited to that form as is.

(Manufacturing Method)

Figure 4:
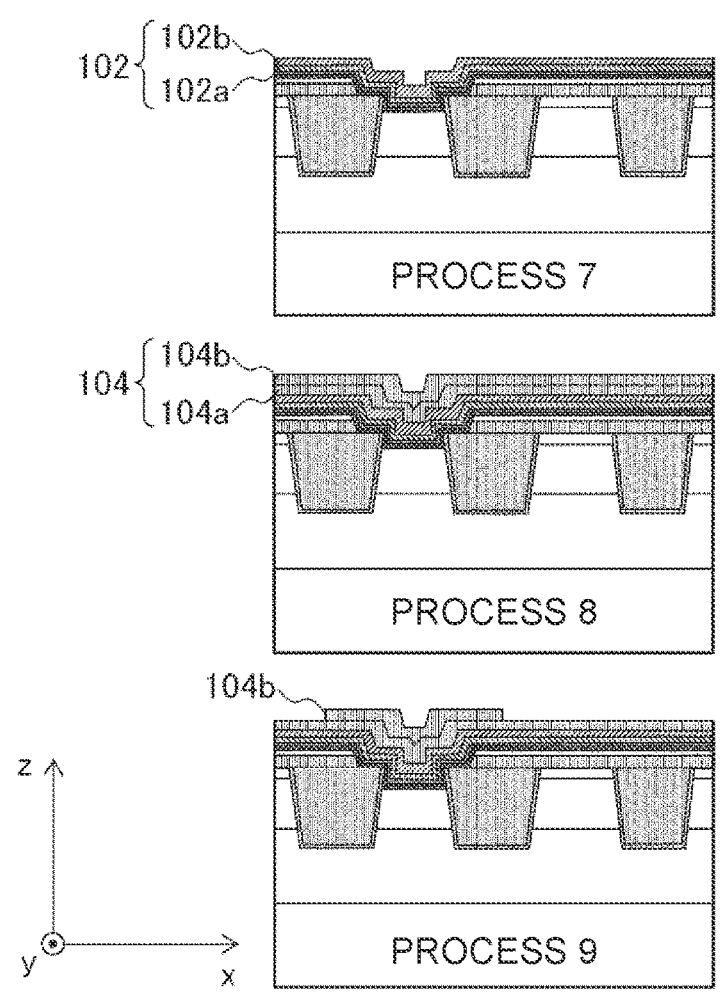
FIG. 4 is a schematic drawing for explaining manufacturing processes (processes 7 through 9) of the semiconductor device relating to the first embodiment of the present invention.
Figure 5:
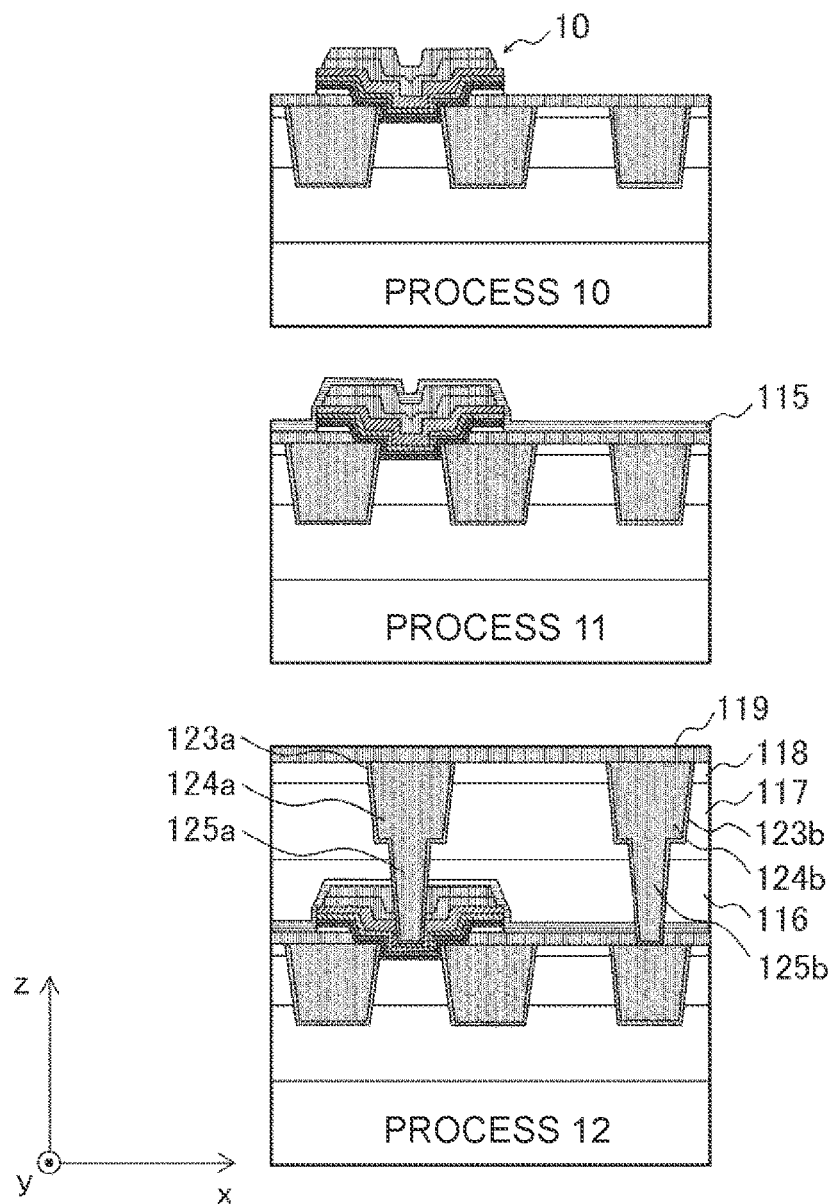
FIG. 5 is a schematic drawing for explaining manufacturing processes (processes 10 through 12) of the semiconductor device relating to the first embodiment of the present invention.

A method of manufacturing the semiconductor device 1 of the present embodiment is described next with reference to the drawings. FIG. 2 through FIG. 5 are schematic drawings for explaining the method of manufacturing the semiconductor device 1. Twelve processes (process 1 through process 12) are included in the manufacturing method that is shown in FIG. 2 through FIG. 5. FIG. 2 is a schematic drawing for explaining process 1 through process 3. 3 is a schematic drawing for explaining process 4 through process 6. FIG. 4 is a schematic drawing for explaining process 7 through process 9. FIG. 5 is a schematic drawing for explaining process 10 through process 12. In FIG. 2 through FIG. 5, the names of the respective processes are shown in a portion of the substrate 110. Further, in the respective processes shown in FIG. 2 through FIG. 5, mainly, only the reference numerals of structural elements that are newly formed are shown, and reference numerals of the structural elements that have already been formed are omitted.

[Process 1]

In process 1 of FIG. 2, the interlayer insulation layer 111, the Low-k layer 112 and the interlayer insulation layer 113 are layered in that order on the substrate 110 on which a semiconductor element is formed. For example, the interlayer insulation layer 111 and the interlayer insulation layer 113 can be formed by a plasma CVD (Chemical Vapor Deposition) method.

For example, a silicon oxide film of a film thickness of 500 nanometers is formed as the interlayer insulation layer 111 on the substrate 110. Next, an SiOCH film of a film thickness of 150 nanometers is formed as the Low-k layer 112 on the upper surface of the interlayer insulation layer 111. Then, a silicon oxide film of a film thickness of 100 nanometers is formed as the interlayer insulation layer 113 on the upper surface of the Low-k layer 112.

Next, the first wiring grooves are formed in the Low-k layer 112 and the interlayer insulation layer 113 by using a lithographic method that includes photoresist formation, dry etching, and photoresist removal. Then, the first barrier metal 122a, the first barrier metal 122b, and the first barrier metal 122c are formed at the inner surfaces of these first wiring grooves.

For example, the first barrier metal 122a, the first barrier metal 122b, and the first barrier metal 122c can be formed by a PVD (Physical Vapor Deposition) method. For example, the first barrier metal 122a, the first barrier metal 122b, and the first barrier metal 122c are structures in which tantalum nitride of a film thickness of 5 nanometers is layered on tantalum of a film thickness of 5 nanometers.

Then, the first wire 121a, the first wire 121b, and the first wire 121c are embedded in the first wiring grooves in which the first barrier metal 122a, the first barrier metal 122b and the first barrier metal 122c have been formed. For example, the first wire 121a, the first wire 121b and the first wire 121c are structured by copper wires.

For example, after copper seeds are formed by a PVD method at the inner sides of the first barrier metal 122a, the first barrier metal 122b and the first barrier metal 122c, copper is embedded in the interiors of the first wiring grooves by an electroplating method. Then, after a heat treatment at a temperature of greater than or equal to 200° C., the excess copper that is at other than the interiors of the first wiring grooves is removed by a CMP method (Chemical Mechanical Polishing), and the first wire 121a, the first wire 121b and the first wire 121c can thereby be formed. A CMP method is a method in which indentations and protrusions on a wafer surface that arise during the multilayer wiring formation process are flattened by polishing by causing a polishing pad that rotates to contact the wafer surface while causing a polishing liquid to flow on the wafer surface. In the CMP method, flattening is carried out by forming the embedded wires (damascene wires) and polishing the interlayer insulating film, by polishing the excess copper embedded in the wiring grooves.

[Process 2]

In process 2 of FIG. 2, the barrier insulation layer 114 is formed on the interlayer insulation layer 113 in which the first wire 121a, the first wire 121b and the first wire 121c are embedded. For example, the barrier insulation layer 114 can be formed by a plasma CVD method.

It is preferable that the barrier insulation layer 114 be formed to a film thickness of around 10 to 50 nanometers. For example, a silicon nitride film or a silicon carbonitride film of a film thickness of 30 nanometers is formed as the barrier insulation layer 114.

[Process 3]

In process 3 of FIG. 2, the oxygen supply layer 105 is formed on the upper surface of the barrier insulation layer 114. From the standpoint of keeping the etching selection ratio in the dry etching process large, it is preferable that the oxygen supply layer 105 be a material that is different than the barrier insulation layer 114. The oxygen supply layer 105 also has the role of a hard mask for etching the barrier insulation layer 114 in process 5.

For example, a silicon oxide film can be used at the oxygen supply layer 105. For example, a silicon oxide film of a film thickness of 40 nanometers is formed as the oxygen supply layer 105. Further, SiCO, SiOC, SiO, SiCOH, or SiON can be used at the oxygen supply layer 105.

[Process 4]

In process 4 of FIG. 3, the opening is patterned on the oxygen supply layer 105 by using a photoresist (not shown), and an opening pattern is formed at the oxygen supply layer 105 by dry etching by using the photoresist as a mask. Thereafter, the photoresist is stripped by oxygen plasma ashing or the like. At this time, the dry etching does not have to be stopped at the upper surface of the barrier insulation layer 114, and may reach as far as the interior of the barrier insulation layer 114.

[Process 5]

In process 5 of FIG. 3, the opening 18 is formed in the barrier insulation layer 114 by etching (dry etching) the barrier insulation layer 114 that is exposed from the opening of the oxygen supply layer 105, by using the oxygen supply layer 105 as a mask. At this time, portions of the first wire 121a and the first wire 121b are exposed at the opening 18 of the barrier insulation layer 4. A mixed gas of a fluorocarbon gas and argon is used in the etching. Concretely, argon is mixed in a ratio of around 10 times to 20 times the fluorocarbon. At this time, oxygen gas is not mixed into the mixed gas of the fluorocarbon gas and argon.

If reactive dry etching is used at the time of etching the barrier insulation layer 114, tapered surfaces can be formed at the inner side surface of the opening 18 of the barrier insulation layer 114. A gas containing fluorocarbon is used as the etching gas in the reactive dry etching. The oxygen supply layer 105 remains also after the etching back. During the etching of the barrier insulation layer 114, the oxygen supply layer 105 supplies oxygen into the etching plasma, and decreases so as to become thin. The residue (scum), which comes from the silicon or the carbon that weakly binds to and remains on the surfaces of the first wire 121*a* and the first wire 121*b*, is removed by the oxygen that is supplied from the oxygen supply layer 105. The effect of the oxygen, which is supplied om be oxygen supply layer 105, on the silicon or carbon, which binds strongly with the Low-k layer 12 that is positioned between the first wire 121*a* and the first wire 121*b*, is small, and therefore, the digging-in is shallow. It is desirable that the thickness of the oxygen supply layer 105 that remains after etch back be less than or equal to 20 nanometers. In the example of the present embodiment, the oxygen supply layer 105 of a thickness of 5 nanometers remains.

[Process 6]

In process 6 of FIG. 3, the ion conducting layers 103 (the first ion conducting layer 103*a*, the second ion conducting layer 103*b*) are formed on the barrier insulation layer 114 in which the first wire 121*a* and the first wire 121*b* are embedded.

First, zirconium is accumulated by a sputtering method on the barrier insulation layer 114 in which the first wire 121*a* and the first wire 121*b* are embedded. For example, the zirconium is accumulated to 1 nanometers. The zirconium is oxidized at the time of forming the second ion conducting layer 103*b*, and becomes the first ion conducting layer 103*a*. For example, after the zirconium is layered, annealing is carried out in a vacuum environment at a temperature of 350° C. It is preferable that, the annealing time be around 2 to 10 minutes. In a case in which the copper of the first wires 121 is oxidized, the oxidized copper is spontaneously reduced at the places where the first wires 121 and the first ion conducting layer 103*a* contact one another. This is because the standard generated Gibbs energy of copper oxide is higher than that of zirconium oxide, and therefore, the oxygen that binds with the copper at the first wires 121 diffuses into the metal that structures the first ion conducting layer 103*a*, and moves to the zirconium side that is even easier to be oxidized.

Moreover, an SiOCH polymer film that contains silicon, oxygen, carbon and hydrogen is formed as the second ion conducting layer 103*b* on the upper surface of the first ion conducting layer 103*a* by plasma CVD. The raw material that is cyclic organic siloxane and helium that is a carrier gas are made to flow into a reaction chamber, and, at the time when the supply of the both is stabilized and the pressure of the reaction chamber becomes constant, application of RF power is started. For example, the raw material that is cyclic organic siloxane is supplied at 10 to 200 sccm. The helium is supplied at 500 sccm via a raw material vaporizer, and is supplied directly into the reaction chamber at 500 sccm by another line. Moisture and the like adhere to the opening 18 of the barrier insulation layer 114 due to exposure to the atmosphere. Therefore, before the accumulating of the first ion conducting layer 103*a*, it is preferable to add a heat treatment under reduced pressure and carry out degassing, at a temperature of around from 250° C. to 350° C.

[Process 7]

In process 7 of FIG. 4, the second electrodes 102 (the lower second electrode 102*a*, the upper second electrode 102*b*) are formed on the upper surface of the ion conducting layer 103 (the second ion conducting layer 103*b*).

An alloy of ruthenium and titanium is formed as the lower second electrode 102*a* by a co-sputtering method on the upper surface of the ion conducting layer 103. At this time, a ruthenium target and a titanium target are set within a same chamber, and, by carrying out sputtering simultaneously, an alloy film is accumulated. For example, an alloy of ruthenium and titanium is formed to a film thickness of 10 nanometers on the upper surface of the ion conducting layer 103. For example, by making the power that is applied to the ruthenium target be 150 watts and the power that is applied to the titanium target be 50 watts, an alloy of ruthenium and titanium that has a ruthenium percentage content of 75 atom percent can be accumulated.

Next, titanium nitride is formed as the upper second electrode 102*b* by a reactive sputtering method on the upper surface of the lower second electrode 102*a*. For example, titanium nitride of a film thickness of 25 nanometers is formed on the upper surface of the lower second electrode 102*a*. At this time, sputtering is carried out by making the power that is applied to the titanium target be 600 watts, and by introducing nitrogen gas and argon gas into the chamber. By setting the flow rate of the nitrogen and the flow rate of the argon to be 1:1, the proportion of the titanium within the titanium nitride can be adjusted to 70 atom percent.

[Process 8]

In process 8 of FIG. 4, the hard mask layers 104 (the first hard mask layer 104*a*, the second hard mask layer 104*b*) are formed on the upper surface of the second electrode 102 (the upper second electrode 102*b*). The hard mask layers 104 can be formed by using a general plasma CVD method.

First, the first hard mask layer 104*a* is accumulated on the upper surface of the upper second electrode 102*b*. For example, a silicon nitride film or a silicon carbonitride film of a film thickness of 30 nanometers is accumulated as the first hard mask layer 104*a*. For example, a high-density silicon nitride film can be formed if a high-density plasma of a mixed gas of silane ($SiH_4$) and nitrogen ($N_2$) is used.

Next, the second hard mask layer 104*b* is accumulated on the upper surface of the first hard mask layer 104*a*. It is preferable that the second hard mask layer 104*b* be structured by a material that is different than the first hard mask layer 104*a*. Further, it is preferable that the second hard mask layer 104*b* be structured by the same material as the protecting insulation layer 115 and the barrier insulation layer 114. For example, a silicon oxide film of a film thickness of 80 nanometers is accumulated as the second hard mask layer 104*b*.

[Process 9]

In process 9 of FIG. 4, the second hard mask layer 104*b* is patterned.

First, a photoresist (not shown) for patterning the switching element 10 is formed on the upper surface of the second hard mask layer 104*b*. Next, by using this photoresist as a mask, the second hard mask layer 104*b* is dry etched until the first hard mask layer 104*a* is exposed. Then, the photoresist is removed by using oxygen plasma ashing and organic stripping. As a result, the second hard mask layer 104*b* is processed into a shape that is based on the photoresist.

[Process 10]

In process 10 of FIG. 5, by using the second hard mask layer 104*b* as a mask, the first hard mask layer 104*a*, the upper second electrode 102*b*, the lower second electrode 102*a* and the ion conducting layer 103 are consecutively dry etched. Although it is preferable that the second hard mask layer 104*b* be completely removed during the etching, it may remain as is.

For example, in a case in which the upper second electrode 102*b* is titanium nitride, processing can be carried out by chlorine-based RIE (Reactive Ion Etching). In a case in which the lower second electrode 102a is an alloy of ruthenium and titanium, RIE processing can be carried out by a chlorine/oxygen based mixed gas. Further, in the etching of the ion conducting layer 103, the dry etching must be stopped above the barrier insulation layer 114 that is at the lower surface thereof. In a case in which the ion conducting layer 103 is a SiOCH based polymer film, and the barrier insulation layer 114 is a silicon nitride film or a silicon carbonitride film, RIE processing can be carried out by adjusting the etching conditions by a carbon tetrafluoride based, a carbon tetrafluoride/chlorine based, a carbon tetrafluoride/chlorine/argon based, or the like mixed gas.

By using a hard mask RIE method such as described above, the switching element 10 can be processed without being exposed to oxygen plasma ashing for removing the resist. Further, after the dry etching, the oxygen supply layer 105 that is at other than the region sandwiched by the barrier insulation layer 114 and the ion conducting layer 103 may remain, or may be removed. In the example of FIG. 5, the oxygen supply layer 105 that is at other than the region sandwiched by the barrier insulation layer 114 and the ion conducting layer 103 is removed. In a case in which the oxygen supply layer 105 remains, the film thickness of the oxygen supply layer 105 at a place sandwiched by the protecting insulation layer 115 and the barrier insulation layer 114 is smaller than that of the oxygen supply layer 105 at a place sandwiched by the barrier insulation layer 114 and the ion conducting layer 103.

[Process 11]

In process 11 of FIG. 5, the protecting insulation layer 115 is accumulated on the barrier insulation layer 114 that includes the hard mask layer 104, the upper second electrode 102b, the lower second electrode 102a and the ion conducting layer 103.

For example, a silicon nitride film or a silicon carbonitride film of a film thickness of 20 nanometers is accumulated as the protecting insulation layer 115 on the barrier insulation layer 114 that includes the hard mask layer 104, the upper second electrode 102b, the lower second electrode 102a and the ion conducting layer 103. The protecting insulation layer 115 can be formed by a plasma CVD method. By the way, in the case of using a plasma CVD method, during the time of maintaining the structure under reduced pressure within the reaction chamber before film formation, there is the possibility that oxygen will desorb from the side surfaces of the ion conducting layer 103, and the leakage current of the ion conducting layer will increase. In order to suppress desorption of oxygen from the side surfaces of the ion conducting layer 103, it is preferable to make the film formation temperature of the protecting insulation layer 115 be less than or equal to 300° C. Moreover, because the structure is exposed to the film forming gas under reduced pressure before film formation, it is preferable to not use a reducible gas. For example, for the protecting insulation layer 115, it is preferable to use a high-density silicon nitride film that has been deposited with the substrate temperature set to 300° C. and with a mixed gas of silane ($SiH_4$) and nitrogen ($N_2$) being set in a high-density plasma state.

[Process 12]

In process 12 of FIG. 5, at least one insulation layer is layered on the protecting insulation layer 115, and the second wires 124 and the vias 125 are embedded into the insulation layer, and the uppermost surface is covered by the barrier insulation layer 119.

First, the interlayer insulation layer 116 is accumulated on the upper surface of the protecting insulation layer 115. For example, a silicon oxide film is accumulated as the interlayer insulation layer 116. Next, the Low-k layer 117 is accumulated on the upper surface of the interlayer insulation layer 16. For example, an SiOCH film of a film thickness of 150 nanometers is accumulated as the Low-k layer 117. Next, the interlayer insulation layer 118 is accumulated on the upper surface of the Low-k layer 117. For example, a silicon oxide film is accumulated as the interlayer insulation layer 118.

The interlayer insulation layer 116, the Low-k layer 117 and the interlayer insulation layer 118 can be formed by a plasma CVD method. Note that, in order to eliminate steps that are formed by the switching element 10, the interlayer insulation layer 116 that has been accumulated thickly may be cut-in and flattened by CMP (Chemical Mechanical Polishing), and the interlayer insulation layer 116 of the desired film thickness formed.

Next, the second wiring grooves for embedding the second wire 124a and the second wire 124b, and the lower holes for embedding the via 125a and the via 125b, are formed. The lower holes for embedding the via 125a and the via 125b are patterned by exposure by the same photomask as the second wiring grooves for embedding the second wire 124a and the second wire 124b, and are etched and formed simultaneously.

Next, the second barrier metal 123a and the second barrier metal 123b are formed at the inner surfaces of the second wiring grooves and the lower holes. For example, tantalum nitride/tantalum are used as the second barrier metal 123a and the second barrier metal 123b.

Next, the second wire 124a, the second wire 124b, the via 125a and the via 125b are formed simultaneously in the interiors of the second wiring grooves and the lower holes via the second barrier metal 123a and the second barrier metal 123b. For example, in a case in which the second wire 124a, the second wire 124b, the via 125a and the via 125b are structured by copper, they can be formed simultaneously by using a copper dual damascene wiring process. The second wire 124a and the second wire 124b can be formed by using a process that is similar to the lower layer wires. At this time, if the second barrier metal 123a and the upper second electrode 102b are made to be the same material, the contact resistance between the second barrier metal 123a and the upper second electrode 102b can be reduced, and the element characteristics of the switching element 10 can be improved.

Then, the barrier insulation layer 119 is accumulated on the interlayer insulation layer 118 in which the second wire 124a and the second wire 124b are embedded. For example, a silicon nitride film is accumulated as the barrier insulation layer 119.

The above has been a description of a method of manufacturing the semiconductor device 1. Note that the above description is an example and does not limit the method of manufacturing the semiconductor device 1 of the present embodiment.

[Related Technique]

Figure 6:
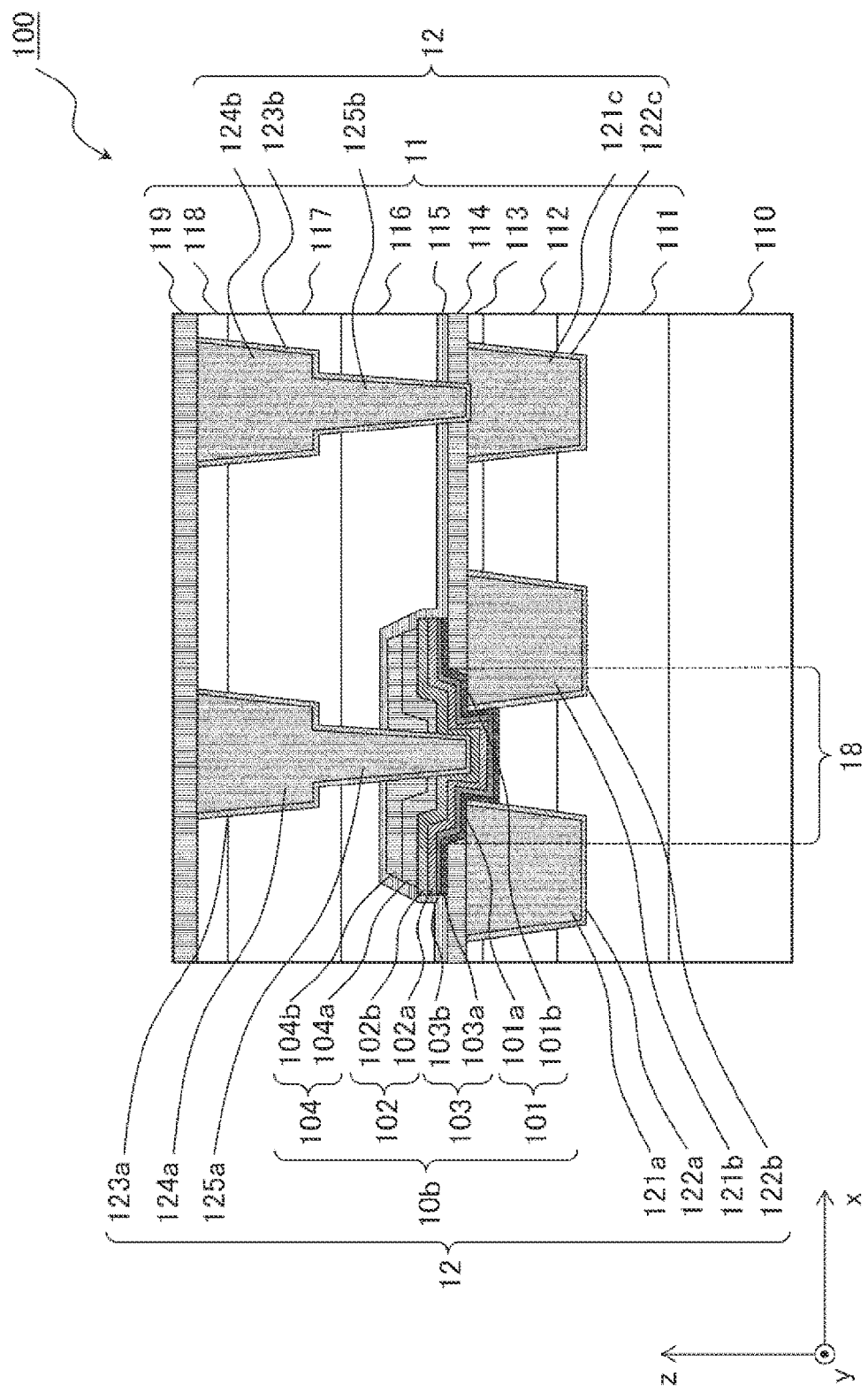
FIG. 6 is a schematic drawing showing an example of the structure of a semiconductor device relating to a related technique.

Next, the switching element 10 that is included in the semiconductor device 1 of the present embodiment is described in comparison with a related technique. FIG. 6 is a cross-sectional view showing an example of the structure of a semiconductor device 100 relating to the related technique. In FIG. 6, structures that are similar to those of the semiconductor device 1 are denoted by the same reference numerals.

The semiconductor device 100 of the related technique (FIG. 6) differs from the semiconductor device 1 of the present embodiment (FIG. 1) with regard to the point that the semiconductor device 100 has a switching element 10b that does not include the oxygen supply layer 105. At the semiconductor device 100 of the related technique (FIG. 6), in the process of forming an opening in the barrier insulation layer 114, etching is carried out by introducing oxygen gas in order to remove the etching residue on the upper surface of a first wire 121. As a result, as compared with the switching element 10 (FIG. 1) of the semiconductor device 1 of the present embodiment, at the switching element 10b (FIG. 6) of a semiconductor device 2 of the related technique, the digging-in between the first electrode 101a and the first electrode 101b is deep. Note that the other structures of the semiconductor device 100 of the related technique (FIG. 6) are similar to structures of the semiconductor device 1 of the present embodiment, and therefore, detailed description thereof is omitted.

[Element Characteristics]

Results of comparison with the switching element 10b (FIG. 6) of the semiconductor device 100 of the related technique are presented in order to explain the element characteristics of the switching element 10 (FIG. 1) of the semiconductor device 1 of the present embodiment.

Here, the results of verifying the set voltage at which the switching element 10b or the switching element 10 transitions from the off state to the on state, and the dielectric breakdown voltage at which the off state dielectrically breaks down, are shown by using a 4 kilobit array. The respective switching elements 10b or switching elements 10 that structure the array are connected in series to a cell transistor for limiting current or for bit access.

First, with regard to the switching element 10b or the switching element 10, the upper second electrode 102b and the lower second electrode 102a were grounded via a via A119a and a second wire A118a. Then, positive voltage was applied to the first wire 121a or the first wire 121b, and metal crosslinking was formed at the interior of the ion conducting layer 103, and the set voltage at which the transition to on occurred was measured. On the other hand, negative voltage was applied to the first wire 121a or the first wire 121b, and the dielectric breakdown voltage of the ion conducting layer 103 was measured. Note that, at the switching element 10b (FIG. 6) of the semiconductor device 100 of the related technique, because the driving force of the cell transistor was low, the limit of the dielectric breakdown voltage was set to 4V.

Figure 7:
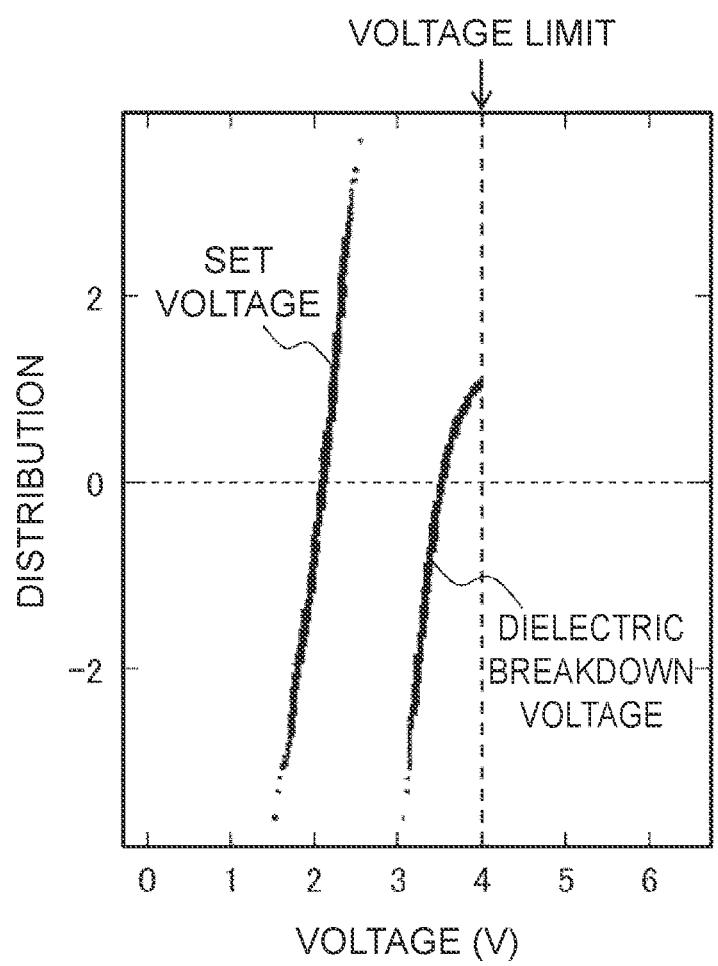
FIG. 7 is a graph showing results of measurement of element characteristics of a switching element that the semiconductor device relating to the related technique has.
Figure 8:
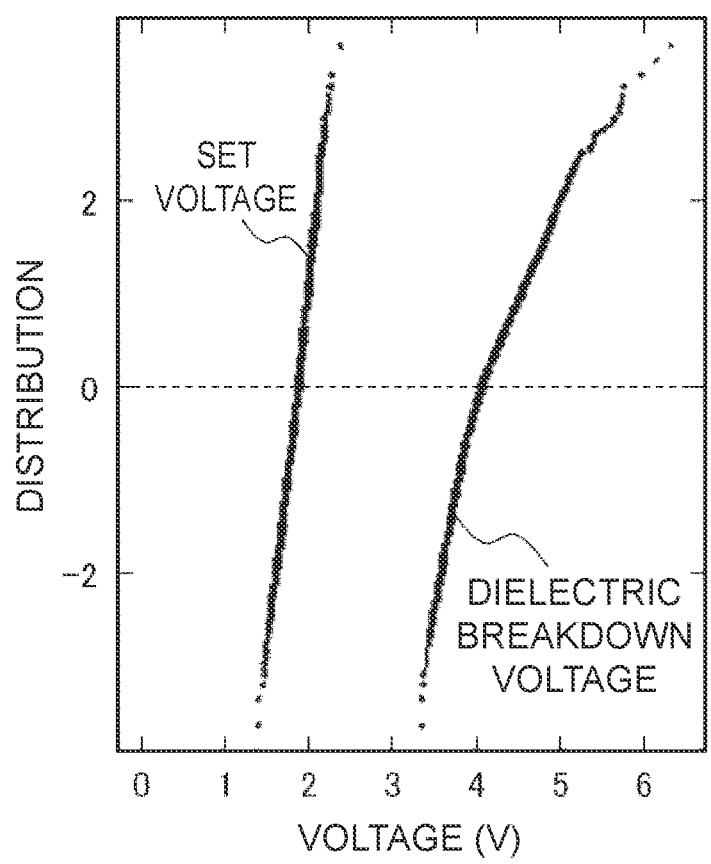
FIG. 8 is a graph showing results of measurement of element characteristics of a switching element that the semiconductor device relating to the first embodiment of the present invention has.

FIG. 7 is a graph showing the results of verifying the element characteristics of the switching element 10b of the semiconductor device 100 of the related technique (FIG. 6). FIG. 8 is a graph showing the results of verifying the element characteristics of the switching element 10 of the semiconductor device 1 of the present embodiment (FIG. 1). The graphs of FIG. 7 and FIG. 8 show the distribution of the set voltage at which the transition from the off state to the on state occurred and the distribution of the dielectric breakdown voltage at which the off state dielectrically broke down, at the time when the switching element 10b or the switching element 10 was used. The graphs of FIG. 7 and FIG. 8 show distributions in which the switching elements 10b the switching elements 10 of a 4 kilobit array were the populations. The horizontal axis shows the voltage values of the set voltage and the dielectric breakdown voltage. The vertical axis is an index (called distribution) in which a value, which is obtained by subtracting the central values from the voltage values of the set voltage and the dielectric breakdown voltage of the switching element 10b or the switching element 10 respectively, is divided by the standard deviation. In the graphs of FIG. 7 and FIG. 8, the voltage value at the time when the vertical axis (distribution) is 0 corresponds to the central values of the set voltage and the dielectric breakdown voltage.

As shown in the graph of FIG. 7, with regard to the switching element 10b of the related technique (FIG. 6), the central value of the set voltage is around 2.0V, and the central value of the dielectric breakdown voltage is around 3.5V. On the other hand, as shown in the graph of FIG. 8, with regard to the switching element 10 of the present embodiment (FIG. 1), the central value of the set voltage is around 1.9V, and the central value of the dielectric breakdown voltage is around 4.1V. Namely, the switching element 10 (FIG. 1) has a smaller central value of the set voltage and a greater central value of the dielectric breakdown voltage than the switching element 10b (FIG. 6).

Generally, at a switching element, a lower set voltage is desirable in order to operate at a low voltage, and a higher dielectric breakdown voltage is desirable in order to obtain high reliability. Namely, the element characteristics of the switching element 10 of the present embodiment (FIG. 1) are better than those of the switching element 10b of the related technique (FIG. 6).

At the semiconductor device 100 of the related technique (FIG. 6), in the process of forming an opening in the barrier insulation layer 114, etching is carried out by introducing oxygen gas in order to remove the etching residue on the upper surface of the first wire 121. In a case of carrying out etching by introducing oxygen gas, because the oxygen plasma that is supplied into the etching chamber has high physical energy, the oxygen plasma acts strongly not only on the etching residue on the upper surface of the first wire 121, but also on the Low-k layer 112. If etching is carried out to the point of completely removing the surface residue on the first wire 121, the Low-k layer 112 is dug-in deeply. Therefore, the dug-in portion between the first electrode 101a and the first electrode 101b is deep, and the first barrier metal 122 at the periphery of the first wire 121 and the ion conducting layer 103 are close to one another. In the semiconductor device 100 of the related technique (FIG. 6), due to it being easy for an electric field to accumulate at places where the first barrier metal 122 at the periphery of the first wire 121 and the ion conducting layer 103 are close, the set voltage increases, and the dielectric breakdown voltage decreases.

On the other hand, in the semiconductor device 1 of the present embodiment, during etching of the opening 18, the residue on the upper surface of the first wire 121 is removed by the oxygen that is generated from the oxygen supply layer 105 that has been formed as a film on the upper surface of the barrier insulation layer 114. The oxygen, which is generated from the oxygen supply layer 105 in a vicinity of the opening 18 of the barrier insulation layer 114, becomes low-energy plasma, and is supplied to the upper surface of the barrier insulation layer 114, and selectively acts on the etching residue whose binding energy is weak, and therefore, the effect on the Low-k layer 112 is weak. Therefore, the dug-in portion between the first electrode 101a and the first electrode 101b is shallow. As a result, as compared with the semiconductor device 100 of the related technique (FIG. 6), at the semiconductor device 1 of the present embodiment (FIG. 1), an increase in the set voltage is suppressed, and a decrease in the dielectric breakdown voltage is suppressed.

Further, the oxidized states of the surfaces of the first wire 121a and the first wire 121b affect the difference in the set voltages of the switching element 10b of the related technique (FIG. 6) and the switching element 10 of the present embodiment (FIG. 1).

In semiconductor device 100 of the related technique (FIG. 6), it is easy for copper oxide to be formed on the surfaces of the first wire 121a and the first wire 121b by the high-energy oxygen plasma. Because copper oxide has similar action as the ion conducting layer 103, when the surfaces of the first wire 121a and the first wire 121b oxidize, the set voltage increases apparently.

On the other hand, at the semiconductor device 1 of the present embodiment (FIG. 1), the etching residue is removed by the low-energy oxygen plasma that is supplied from the oxygen supply layer 105. Therefore, oxidation of the first wire 121a and the first wire 121b can be suppressed, and increases in the switching voltage and the leakage current can be suppressed, more in the switching element 10 of the present embodiment (FIG. 1). As a result, the set voltage is lower in the switching element 10 of the present embodiment (FIG. 1) than in the switching element 10b of the related technique (FIG. 6). Namely, in accordance with the semiconductor device 1 of the present embodiment (FIG. 1), by having the oxygen supply layer 105, the effect of suppressing oxidation of the first wire 121b and the first wire 105b, and the effect of removing etching residue, can both be achieved.

As described above, the semiconductor device of the present embodiment has the three-terminal type switching element having the first electrode, the second electrode, the ion conducting layer, the first insulation layer, the second insulation layer and the oxygen supply layer, and has the substrate, the third insulation layer, the fourth insulation layer, the multilayer wiring layer and the protecting insulation layer. Moreover, the switching element has the hard mask layer that is at least one layer that is formed on the upper surface of the ion conducting layer and through which the second wiring groove passes.

The first insulation layer is an insulation layer at which the first wire whose main component is copper is embedded in the first wiring groove that opens upward. The first insulation layer has the first interlayer insulation layer that is formed on the upper surface of the substrate, the first low dielectric constant interlayer insulation layer that is formed on the upper surface of the first interlayer insulation layer and through which the first wiring groove passes, and the second interlayer insulation layer that is formed on the upper surface of the first low dielectric constant interlayer insulation layer and through which the first wiring groove passes. The second insulation layer is an insulation layer that is formed on the upper surfaces of the first insulation layer and the first wire, and in which the opening that extends to the first insulation layer and the first wire is formed. The first electrode is the portion of the first wire which portion is exposed from the opening. The oxygen supply layer is formed on the upper surface of second insulation layer, and generates oxygen plasma at the time of the etching that forms the opening in the second insulation layer, and that remains at, of the upper surface of the second insulation layer, at least the periphery of the opening. The ion conducting layer is an insulation layer that is formed on the upper surfaces of the first insulation layer and the first electrode that are exposed from the opening, and on the inner side surfaces of the opening of the second insulation layer, and on the upper surface of the oxygen supply layer. The second electrode is formed on the upper surface of the ion conducting layer.

The first insulation layer is formed on the upper surface of the substrate. The protecting insulation layer covers regions above the switching element and the second insulation layer. The third insulation layer is formed above the protecting insulation layer, and the second wiring groove, in which is embedded the second wire that is electrically connected to the second electrode, is formed therein. The third insulation layer has the third interlayer insulation layer that is formed on the upper surface of the protecting insulation layer, the second low dielectric constant interlayer insulation layer that is formed on the upper surface of the third interlayer insulation layer, and the fourth interlayer insulation layer that is formed on the upper surface of the second low dielectric constant interlayer insulation layer. The second wiring groove passes-through the third interlayer insulation layer, the second low dielectric constant interlayer insulation layer and the fourth interlayer insulation layer. The fourth insulation layer covers the upper surfaces of the third insulation layer and the second wire. The multilayer wiring layer has at least the first wire and the second wire.

The multilayer wiring layer has the via that electrically connects the second wire and the second electrode, the first barrier metal that covers the inner surfaces of the first wiring groove, and the second barrier metal that covers the inner surfaces of the second wiring groove. The first wire is embedded in the inner side of the first barrier metal. The via is embedded in the inner side lower portion of the second barrier metal, and the second wire is embedded in the inner side upper portion.

In one aspect of the present embodiment, the ion conducting layer has the first ion conducting layer that is formed on the upper surfaces of the first insulation layer and the first electrode that are exposed from the opening, and on the inner side surfaces of the opening of the second insulation layer, and on the upper surface of the oxygen supply layer, and the second ion conducting layer that is formed on the upper surface of the first ion conducting layer. For example, the first ion conducting layer is structured by a material whose main component is a metal oxide, and the second ion conducting layer is structured by a material that includes at least silicon, oxygen and carbon.

In the method of manufacturing a switching element of the present embodiment, the second insulation layer is formed on the upper surface of the first insulation layer at which the first wire whose main component is copper is embedded in the first wiring groove that opens upward, and the oxygen supply layer is formed on the upper surfaces of the second insulation layer and the first wire. Next, the oxygen supply layer is patterned, and by carrying out dry etching by using the patterned oxygen supply layer as a hard mask, the opening that extends to the upper surfaces of the second insulation layer and the first wire is formed in the second insulation layer. Then, the residue on the surface of the first wire that is exposed from the opening is removed by the oxygen plasma that is generated by dry etching the oxygen supply layer. Moreover, the ion conducting layer is formed on the upper surfaces of the first insulation layer and the first wire that are exposed from the opening, and on the inner side surfaces of the opening of the second insulation layer, and on the upper surface of the oxygen supply layer, and the second electrode is formed on the upper surface of the ion conducting layer.

In the method of manufacturing a switching element of an aspect of the present embodiment, further, the hard mask layer that is at least one layer is formed on the upper surface of the second electrode, and the photoresist, which is for patterning the switching element, is formed on the upper surface of the hard mask layer. Next, after the hard mask layer is dry etched by using the photoresist as a mask, the photoresist is removed. Then, the second electrode, the ion conducting layer and the oxygen supply layer are consecutively dry etched by using the hard mask layer as a mask, such that the oxygen supply layer remains at the regions below the sides of the end portions of the ion conducting layer.

In the manufacturing of a semiconductor device of the related technique, there is the process of forming the opening in the barrier insulation layer and exposing the copper wire at the time of forming the three-terminal switch at the edge of the copper wire. In this process, if residue that comes from the etched barrier insulation layer remains on the copper electrode, the film thickness of the ion conducting layer is apparently thick. If the film thickness of the ion conducting layer is thick, the switching voltage increases. Therefore, in the related technique, at the time of etching in order to form an opening in the barrier insulation layer, oxygen plasma is generated by introducing oxygen gas, and residue components that come from the silicon and the carbon that are used in the barrier insulation layer are removed. At this time, due to the compounds that are decomposed and generated by the oxygen plasma, the digging-in, by which the Low-k layer that is disposed at other than the edge portions of the copper wire is formed toward the downward direction of the substrate, becomes deep, and the barrier metal of the copper wire and the ion conducting layer are near one another. If the barrier metal of the copper wire and the ion conducting layer are near one another, it is easy for an electric field to concentrate at the place at which they are near, and therefore, the switching voltage increases and the dielectric breakdown voltage decreases.

In the manufacturing of a semiconductor device of the present embodiment, at time of forming the opening in the barrier insulation layer and exposing the copper wire, by etching the insulating film, which is formed on the upper surface of the barrier insulation layer and includes at least oxygen and silicon, without introducing oxygen gas, low-energy oxygen plasma is generated. The oxygen plasma generated at this time removes the residue that remains on the upper surface of the copper wire. Because the oxygen plasma must be continued to be supplied until the copper wire is exposed, the insulating film that contains at least oxygen and silicon remains up to after the copper wire is exposed.

In accordance with the present embodiment, digging-in of the edges of the copper wire is suppressed, and the places where the barrier metal of the copper wire and the ion conducting layer are near to one another are reduced. Therefore, the concentrating of electric fields between the ion conducting layer and the barrier metal is mitigated. As a result, in the semiconductor device of the present embodiment, the dielectric breakdown voltage is high, and the switching voltage is low. Namely, in accordance with the present embodiment, a switching element that is highly reliable and whose consumed electric power is low can be manufactured at a high yield.

Further, in the semiconductor device of the present embodiment, because oxidation of the copper wire surface is suppressed, the switching voltage is low, and the leakage current is low. Therefore, in accordance with the present embodiment, a rewritable semiconductor device, which includes a switching element that is highly reliable and whose consumed electric power is low, can be provided at a high yield.

Namely, in accordance with the present embodiment, because trouble that is due to dielectric breakdown can be suppressed, redundancy of circuits that remedy defective bits can be reduced, and a programmable logic that is higher performance and whose consumed electric power is lower can be provided.

Second Embodiment

A semiconductor device relating to a second embodiment of the present invention is described next with reference to the drawings. The semiconductor device of the present embodiment has a structure that includes a two-terminal type switching element (also called two-terminal switch) at the interior of a multilayer wiring layer that is formed on a substrate. The semiconductor device of the present embodiment has a structure that is similar to that of the semiconductor device of the first embodiment, other than the point that the switching element is a two-terminal switch. Note that the semiconductor device of the present embodiment is a schematic structure for explaining the characteristic points of the present embodiment, and the scale and shapes and the like are not expressed accurately.

Figure 9:
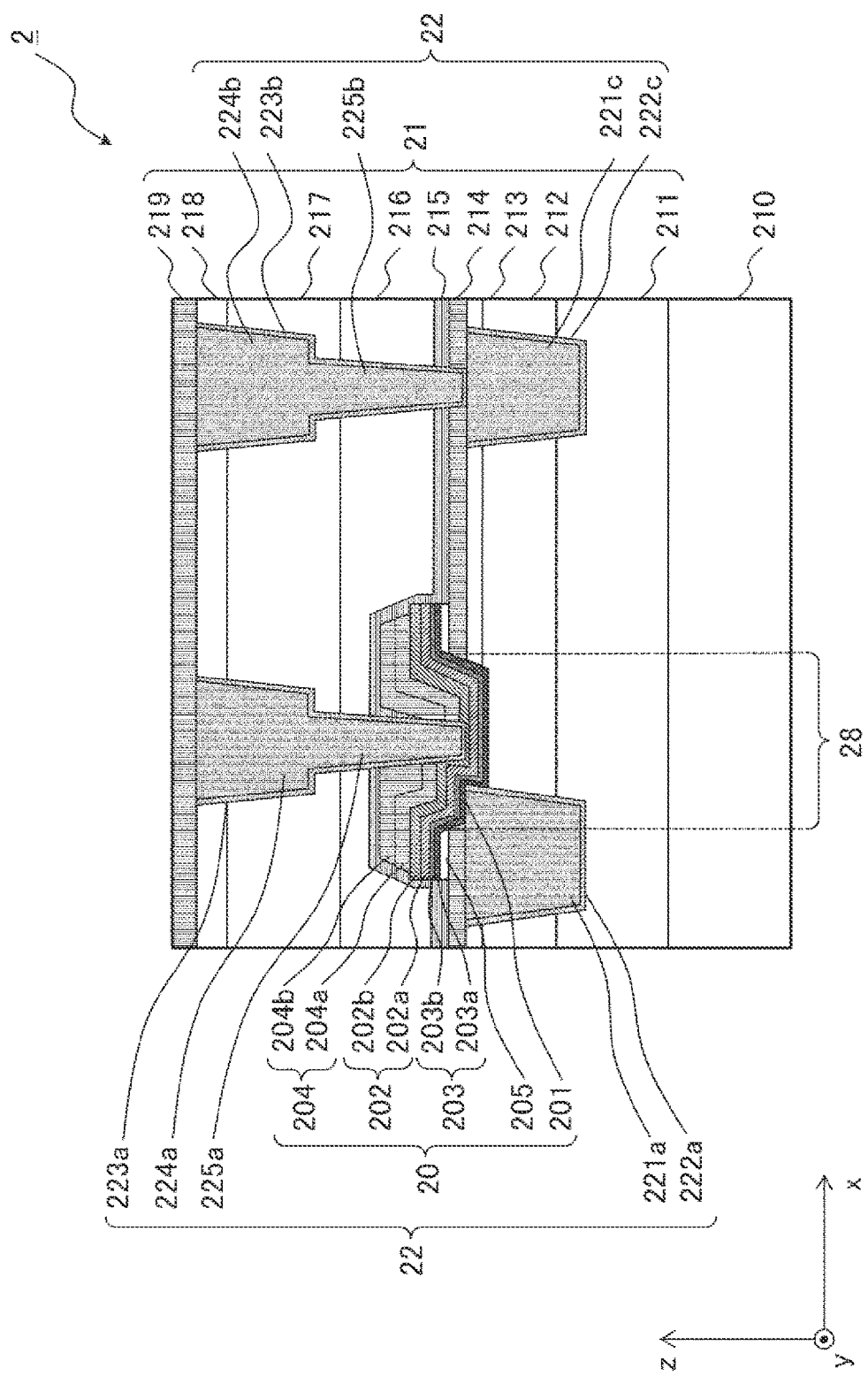
FIG. 9 is a schematic drawing showing an example of the structure of a semiconductor device relating to a second embodiment of the present invention.

FIG. 9 is a cross-sectional view showing an example of the structure of the semiconductor device 2 of the present embodiment. As shown in FIG. 9, the semiconductor device 2 has a substrate 210, a switching element 20, an insulating layered body 21, and a multilayer wiring layer 22. In the following description, there are cases in which letters are appended to the reference numerals denoting the structural elements, in order to differentiate between the individual structural elements. Further, letters for differentiating between the respective structural elements may be omitted in cases of not differentiating between individual structural elements.

The substrate 210 is a substrate on which a semiconductor element is formed. For example, a substrate such as a silicon substrate, a single crystal substrate, an SOI (Silicon on Insulator) substrate, a TFT (Thin Film Transistor) substrate, a substrate for liquid crystal manufacturing, or the like can be used as the substrate 210. The switching element 20, the insulating layered body 21, and the multilayer wiring layer 22 are formed above the substrate 210.

The switching element 20 is a two-terminal switch that is formed at the interior of the insulating layered body 21. The switching element 20 shares some structural components with the multilayer wiring layer 22. The switching element 20 has a first electrode 201, a second electrode 202, an ion conducting layer 203, a hard mask layer 204, and an oxygen supply layer 205. The second electrode 202 includes a lower second electrode 202a and an upper second electrode 202b. The ion conducting layer 203 includes a first ion conducting layer 203a and a second ion conducting layer 203b. The hard mask layer 204 includes a first hard mask layer 204a and a second hard mask layer 204b.

The switching element 20 is a two-terminal switch that includes a first variable resistance element. The first variable resistance element is structured by the first electrode 201, the first ion conducting layer 203a, the second ion conducting layer 203b, the lower second electrode 202a, and the upper second electrode 202b.

The insulating layered body 21 is a layered body of insulation layers at which the switching element 20 and the multilayer wiring layer 22 are formed. The insulating layered body 21 has a structure in which an interlayer insulation layer 211, a Low-k layer 212, an interlayer insulation layer 213, a barrier insulation layer 214, a protecting insulation layer 215, an interlayer insulation layer 216, a Low-k layer 217, an interlayer insulation layer 218, and a barrier insulation layer 219 are layered in that order. The interlayer insulation layer 211, the Low-k layer 212, and the interlayer insulation layer 213 correspond to the first insulation layer. The barrier insulation layer 214 corresponds to the second insulation layer. The interlayer insulation layer 216, the Low-k layer 217 and the interlayer insulation layer 218 correspond to the third insulation layer. The barrier insulation layer 219 corresponds to the fourth insulation layer.

The multilayer wiring layer 22 is a wiring layer that is formed at the interior of the insulating layered body 21. The multilayer wiring layer 22 is structured by a first wire 221, a first barrier metal 222, a second barrier metal 223, a second wire 224, and a via 225. The portion of the first wire 221 which portion contacts the ion conducting layer 203 is the first electrode 201. The first wire 221 includes a first wire 221a and a first wire 221c. The first barrier metal 222 includes a first barrier metal 222a and a first barrier metal 222c. The second barrier metal 223 includes a second barrier metal 223a and a second barrier metal 223b. The second wire 224 includes a second wire 224a and a second wire 224b. The via 225 includes a via 225a and a via 225b.

An opening 28 is formed in the barrier insulation layer 214. The Low-k layer 212 is exposed at the bottommost surface of the opening 18. The opening 28 is formed so as to be tapered toward the depth direction (the −Z direction). The inner side surfaces of the opening 28 that is formed in the barrier insulation layer 214 are tapered surfaces that are tapered toward the depth direction.

The above has been a description of the structure of the semiconductor device 2. Note that the above-described structure of the semiconductor device 2 is an example, and the structure of the semiconductor device 2 of the present embodiment is not limited to that form as is.

[Switching Element]

Next, the switching element 20 is described with reference to FIG. 9. Note that, because the insulating layered body 21 and the multilayer wiring layer 22 are similar to the insulating layered body 21 and the multilayer wiring layer 22 of the first embodiment, detailed description thereof is omitted.

As shown in FIG. 9, the switching element 20 is structured by the first electrode 201, the second electrode 202, the ion conducting layer 203, the hard mask layer 204, and the oxygen supply layer 205. Note that the hard mask layer 204 may be considered to be a structure of the insulating layered body 21, and not a structure of the switching element 20. Hereinafter, description of the materials and methods of forming and the like of the structural elements of the switching element 20 is omitted.

The first electrode 201 is an active electrode. A metal that can diffuse or that can conduct ions at the ion conducting layer 203 is used at the first electrode 201. The first electrode 201 is a portion of the first wire 221a that is one layer of the multilayer wiring layer 22 that is formed on the substrate 210. Of the first wire 221a, the upper surface portion, which is exposed from the opening 28 of the barrier insulation layer 214 and is covered by the ion conducting layer 203, structures the first electrode 201. Of the first wire 221, the upper surface portion that is not exposed from the opening 28 is covered by the barrier insulation layer 214. The switching element 20 of FIG. 9 is a two-terminal switch in which the one first electrode 201 corresponds to the one second electrode 202.

The second electrode 202 is an inactive electrode. The second electrode 202 is formed on the upper surface of the ion conducting layer 203. The side surfaces of the second electrode 202 and the upper surface of the peripheral edge portions thereof are covered by the protecting insulation layer 215. The second electrode 202 includes the lower second electrode 202a and the upper second electrode 202b.

The lower second electrode 202a is formed on the upper surface of the ion conducting layer 203. The upper second electrode 202b is formed on the upper surface of the lower second electrode 202a. The side surfaces of the lower second electrode 202a are covered by the protecting insulation layer 215.

The lower second electrode 202a is the electrode at the lower layer side of the upper electrode of the switching element 20, and, at the lower surface thereof, contacts the second ion conducting layer 203b. An alloy containing a metal, which is more difficult to ionize than the metal that structures the first wire 221 and which has difficulty diffusing or conducting ions at the second ion conducting layer 203b, and a metal, which has good adhesion to the metal that structures the first wire 221, is used at the lower second electrode 202a.

The upper second electrode 202b is the electrode at the upper layer side of the upper electrode of the switching element 20, and is formed on the upper surface of the lower second electrode 202a. The side surfaces of the upper second electrode 202b and the upper surface of the peripheral portions thereof are covered by the protecting insulation layer 215.

The upper second electrode 202b has the function of protecting the lower second electrode 202a. Due to the upper second electrode 202b protecting the lower second electrode 202a, damage to the lower second electrode 202a in the process of manufacturing the semiconductor device 2 is suppressed, and the switching characteristics of the switching element 20 can be maintained.

The ion conducting layer 203 is formed along the upper surface of the oxygen supply layer 205, the inner side surfaces of the opening 28 of the barrier insulation layer 214 and the oxygen supply layer 205, the upper surface of the first electrode 201, portions of the upper surface and the side surfaces of the first barrier metal 222, and a portion of the upper surface of the Low-k layer 212. The second electrode 202 is formed at the upper surface of the ion conducting layer 203.

The ion conducting layer 203 is a film whose electrical resistance varies due to voltage being applied between the first electrode 201 and the second electrode 202. A material whose electrical resistance varies due to an action such as the diffusion of or the ion conduction of or the like of the metal ions that are generated from the metal that structures the first wire 221a, can be used at the ion conducting layer 203. For example, in a case in which varying of the resistance of the switching element 20 that accompanies switching to the on state is carried out by the precipitation of the metal due to the reduction of metal ions, a film that can conduct ions is used at the ion conducting layer 203. The ion conducting layer 203 includes the first ion conducting layer 203a and the second ion conducting layer 203b.

The first ion conducting layer 203a is formed along the upper surface of the oxygen supply layer 205, the inner side surfaces of the opening 28 of the barrier insulation layer 214 and the oxygen supply layer 205, the upper surface of the first electrode 201, portions of the upper surface and the side surfaces of the first barrier metal 222, and a portion of the upper surface of the Low-k layer 212. The second ion conducting layer 203b is formed on the upper surface of the first ion conducting layer 203a.

The second ion conducting layer 203b is formed on the upper surface of the first ion conducting layer 203a. The lower second electrode 202a is formed on the upper surface of the second ion conducting layer 203b.

The hard mask layer 204 is formed above the ion conducting layer 203. The hard mask layer 204 is a mask that is used at the time of manufacturing the switching element 20. The hard mask layer 204 is a film that also serves as a hard mask film and a passivation film at the time of etching the lower second electrode 202a, the upper second electrode 202b, the first ion conducting layer 203a and the second ion conducting layer 203b.

The hard mask layer 204 includes the first hard mask layer 204a and the second hard mask layer 204b. The first hard mask layer 204a is formed on the upper surface of the upper second electrode 202b. The second hard mask layer 104b is formed on the upper surface of the first hard mask layer 104a. Note that the second hard mask layer 104b may be completely removed during etching.

The oxygen supply layer 205 is formed on the upper surface of the barrier insulation layer 214. The opening 28 is formed in the oxygen supply layer 205. The first ion conducting layer 203a of the ion conducting layer 203 is formed on the upper surface of the oxygen supply layer 205 and the inner side surfaces of the opening 28. Namely, the oxygen supply layer 205 is interposed between the upper surface of the barrier insulation layer 214 and the lower surface of the first ion conducting layer 203a. Note that the first ion conducting layer 203a is disposed at the opening 28 of the barrier insulation layer 214, but the oxygen supply layer 205 is not disposed thereat.

The oxygen supply layer 205 has the role of supplying oxygen at the time when the opening 28 of the barrier insulation layer 214 is formed. The oxygen supply layer 205 may also serve as a hard mask at the time of forming the opening 28 of the barrier insulation layer 214. The oxygen supply layer 205 may be completely removed at the time when the lower second electrode 202a and the upper second electrode 202b are etched, but may remain between the barrier insulation layer 214 and the protecting insulation layer 215.

Further, the oxygen supply layer 205 may be extended onto the barrier insulation layer 214. If the oxygen supply layer 205 is extended onto the barrier insulation layer 214, the film thickness that is interposed between the protecting insulation layer 215 and the barrier insulation layer 214 is smaller than the film thickness that is interposed between the ion conducting layer 203 and the barrier insulation layer 214. Further, if the oxygen supply layer 205 is extended onto the barrier insulation layer 214, because the second ion conducting layer 203b and the oxygen supply layer 205 are both oxides, the adhesion is greater than between the second ion conducting layer 203b and the barrier insulation layer 214.

The oxygen supply layer 205 generates oxygen gas at the time of the etching that forms the opening 28 in the barrier insulation layer 214. At the time of the etching that forms the opening 28 in the barrier insulation layer 214, residue components, which come from the silicon (Si) and the carbon (C) that are used in the barrier insulation layer 214, remain on the upper surface of the first wire 221a. The residue components that remain on the upper surface of the first wire 221a are oxidized by the oxygen gas generated from the oxygen supply layer 205, and are removed.

The above has been a description of the structure of the switching element 20. Note that the above-described structure of the switching element 20 is an example, and the structure of the switching element 20 of the present embodiment is not limited to that form as is.

As described above, the semiconductor device of the present embodiment has the two-terminal type switching element having the first electrode, the second electrode, the ion conducting layer, the first insulation layer, the second insulation layer and the oxygen supply layer, and has the substrate, the third insulation layer, the fourth insulation layer, the multilayer wiring layer and the protecting insulation layer. Moreover, the switching element has the hard mask layer that is at least one layer that is formed on the upper surface of the ion conducting layer and through which the second wiring groove passes.

The first insulation layer is an insulation layer at which the first wire whose main component is copper is embedded in the first wiring groove that opens upward. The first insulation layer has the first interlayer insulation layer that is formed on the upper surface of the substrate, the first low dielectric constant interlayer insulation layer that is formed on the upper surface of the first interlayer insulation layer and through which the first wiring groove passes, and the second interlayer insulation layer that is formed on the upper surface of the first low dielectric constant interlayer insulation layer and through which the first wiring groove passes. The second insulation layer is an insulation layer that is formed on the upper surfaces of first insulation layer and the first wire, and in which the opening that extends to the first insulation layer and the first wire is formed. The first electrode is the portion of the first wire which portion is exposed from the opening. The oxygen supply layer is formed on the upper surface of the second insulation layer, and generates oxygen plasma at the time of the etching that forms the opening in the second insulation layer, and that remains at, of the upper surface of the second insulation layer, at least the periphery of the opening. The ion conducting layer is an insulation layer that is formed on the upper surfaces of the first insulation layer and the first electrode that are exposed from the opening, and on the inner side surfaces of the opening of the second insulation layer, and on the upper surface of the oxygen supply layer. The second electrode is formed on the upper surface of the ion conducting layer.

The first insulation layer is formed on the upper surface of the substrate. The protecting insulation layer covers the regions above the switching element and the second insulation layer. The third insulation layer is formed above the protecting insulation layer, and the second wiring groove, in which is embedded the second wire that is electrically connected to the second electrode, is formed therein. The third insulation layer has the third interlayer insulation layer that is formed on the upper surface of the protecting insulation layer, the second low dielectric constant interlayer insulation layer that is formed on the upper surface of the third interlayer insulation layer, and the fourth interlayer insulation layer that is formed on the upper surface of the second low dielectric constant interlayer insulation layer. The second wiring groove passes-through the third interlayer insulation layer, the second low dielectric constant interlayer insulation layer and the fourth interlayer insulation layer. The fourth insulation layer covers the upper surfaces of the third insulation layer and the second wire. The multilayer wiring layer has at least the first wire and the second wire.

The multilayer wiring layer has the via that electrically connects the second wire and the second electrode, the first barrier metal that covers the inner surfaces of the first wiring groove, and the second barrier metal that covers the inner surfaces of the second wiring groove. The first wire is embedded in the inner side of the first barrier metal. The via is embedded in the inner side lower portion of the second barrier metal, and the second wire is embedded in the inner side upper portion.

In one aspect of the present embodiment, the ion conducting layer has the first ion conducting layer that is formed on the upper surfaces of the first insulation layer and the first electrode that are exposed from the opening, and on the inner side surfaces of the opening of the second insulation layer, and on the upper surface of the oxygen supply layer, and the second ion conducting layer that is formed on the upper surface of the first ion conducting layer. For example, the first ion conducting layer is structured by a material whose main component is a metal oxide, and the second ion conducting layer is structured by a material that includes at least silicon, oxygen and carbon.

In the method of manufacturing a switching element of the present embodiment, the second insulation layer is formed on the upper surface of the first insulation layer at which the first wire whose main component is copper is embedded in the first wiring groove that opens upward, and the oxygen supply layer is formed on the upper surfaces of the second insulation layer and the first wire. Next, the oxygen supply layer is patterned, and by carrying out dry etching by using the patterned oxygen supply layer as a hard mask, the opening that extends to the upper surfaces of the second insulation layer and the first wire is formed in the second insulation layer. Then, the residue on the surface of the first wire that is exposed from the opening is removed by the oxygen plasma that is generated by dry etching the oxygen supply layer. Moreover, the ion conducting layer is formed on the upper surfaces of the first insulation layer and the first wire that are exposed from the opening, and on the inner side surfaces of the opening of the second insulation layer, and on the upper surface of the oxygen supply layer, and the second electrode is formed on the upper surface of the ion conducting layer.

In the method of manufacturing a switching element of an aspect of the present embodiment, further, the hard mask layer that is at least one layer is formed on the upper surface of the second electrode, and the photoresist, which is for patterning the switching element, is formed on the upper surface of the hard mask layer. Next, after the hard mask layer is dry etched by using the photoresist as a mask, the photoresist is removed. Then, the second electrode, the ion conducting layer and the oxygen supply layer are consecutively dry etched by using the hard mask layer as a mask, such that the oxygen supply layer remains at the regions below the sides of the end portions of the ion conducting layer.

In accordance with the present embodiment, a two-terminal switching device that is highly reliable and whose consumed electric power is low can be manufactured at a high yield.

Third Embodiment

A switching element relating to a third embodiment of the present invention is described next with reference to the drawings. The switching element of the present embodiment relates to the switching element 10 that is included in the semiconductor device of the first embodiment.
(Structure)

Figure 10:
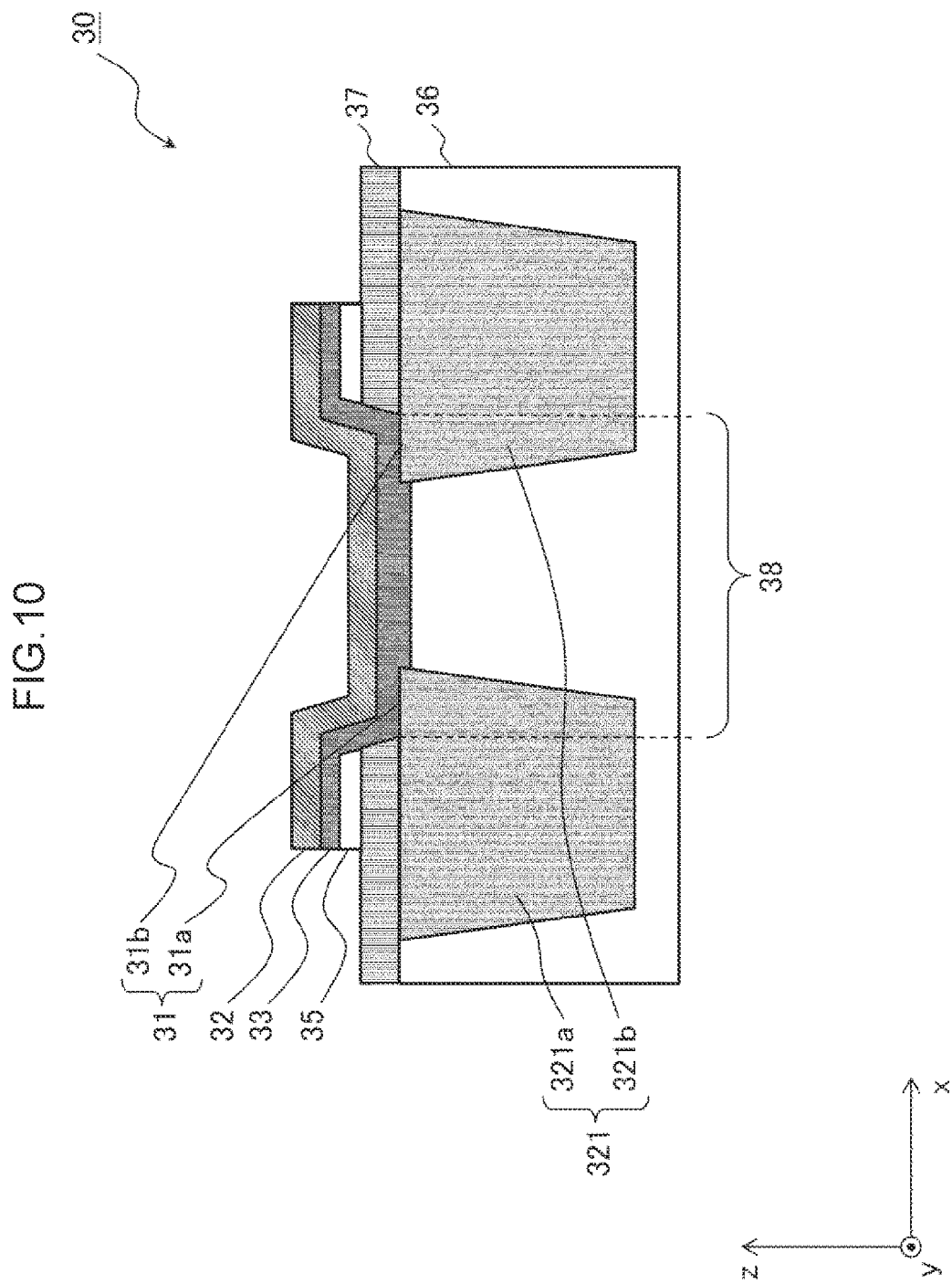
FIG. 10 is a schematic drawing showing an example of the structure of a switching element relating to a third embodiment of the present invention.

FIG. 10 is a cross-sectional view for explaining an example of the structure of a switching element 30 of the present embodiment. As shown in FIG. 10, the switching element 30 has a first electrode 31, a second electrode 32, an ion conducting layer 33, an oxygen supply layer 35, a first insulation layer 36 and a second insulation layer 37. The first electrode 31, the second electrode 32, the ion conducting layer 33 and the oxygen supply layer 35 structure the switching element 30.

The switching element 30 of FIG. 10 is a three-terminal type switching element (also called three-terminal switch) that includes a first variable resistance element and a second variable resistance element. The first variable resistance element is structured by a first electrode 31a, the ion conducting layer 33 and the second electrode 32. The second variable resistance element is structured by a first electrode 31b, the ion conducting layer 33 and the second electrode 32.

An opening 38 is formed in the second insulation layer 37. For example, the opening 38 is formed so as to be tapered toward the depth direction (the −Z direction). In this case, the inner side surfaces of the opening 38 that is formed in the second insulation layer 37 form tapered surfaces that are tapered toward the depth direction.

The first electrode 31 is a portion of a first wire 321 that is one layer of the multilayer wiring layer and is embedded in a wiring groove formed in the first insulation layer 36 that is layered on the substrate. The first electrode 31 is structured by the first electrode 31a and the first electrode 31b. The first electrode 31a is a portion of the upper surface of a first wire 321a. The first electrode 31b is a portion of the upper surface of a first wire 321b. In the following description, the first wire 321a and the first wire 321b are called the first wire 321 without differentiating therebetween, and the first electrode 31a and the first electrode 31b are called the first electrode 31 without differentiating therebetween.

For example, the first electrode 31 is an active electrode. In this case, a metal that diffuses or that can conduct ions at the ion conducting layer 33 is used at the first electrode 31. For example, a metal whose main component is copper is used at the first electrode 31. The second insulation layer 37 is layered on the upper portion of the first electrode 31. As seen from a viewpoint at the upper surface side of the substrate, the first electrode 31 is exposed at the opening 38 that is formed in the second insulation layer 37. The exposed portion of the first electrode 31 is covered by the ion conducting layer 33 at the opening 38 that is formed in the second insulation layer 37.

For example, the second electrode 32 is an inactive electrode that is layered on the ion conducting layer 33. The second electrode 32 is structured of a material that is more difficult to ionize than the metal that is contained in the first electrode 31. It is preferable to use an alloy of a metal that is difficult to diffuse or to conduct ions at the ion conducting layer 33, and a metal that has good adhesion to the metal contained in the first electrode 31, at the second electrode 32. An unillustrated insulation layer is formed above the second electrode 32, and an unillustrated via and second wire are embedded in the interior of this insulation layer. The second electrode 32 is connected to the second wire by the unillustrated via.

The ion conducting layer 33 is layered on the second insulation layer 37, and covers the first electrode 31 at the inner side of the opening 38 that is formed in the second insulation layer 37. The metal that is contained in the first electrode 31 is ionized and diffuses at the interior of the ion conducting layer 33. In other words, the ion conducting layer 33 is an ion conducting layer that can conduct ions of the metal that structures the first electrode 31. By controlling the voltage or current that is applied between the first electrode 31 and the second electrode 32, the metal ions that have diffused in the interior of the ion conducting layer 33 can be precipitated.

The ion conducting layer 33 is a film whose electrical resistance varies. A material, whose electrical resistance varies due to action such as the diffusion of or the ion conduction of or the like of the metal ions that are generated from the metal contained in the first electrode 31, can be used at the ion conducting layer 33. In particular, a material that can conduct ions is used at the ion conducting layer 33 in a case in which the resistance state of the switching element 30 is controlled by the precipitating of metal due to reduction of the metal ions.

At the interior region of the opening 38, the ion conducting layer 33 contacts the upper surfaces of the first electrode 31 and the first insulation layer 36, and contacts the tapered surfaces formed at the first electrode 31, the first insulation layer 36 and the second insulation layer 37. Further, at the peripheral region of the opening 38, the ion conducting layer 33 contacts the upper surface of the oxygen supply layer 35.

The oxygen supply layer 35 is formed on the upper surface of the second insulation layer 37. The opening 38 is formed in the oxygen supply layer 35. The ion conducting layer 33 is formed on the upper surface of the oxygen supply layer 35 and on the inner side surfaces of the opening 38. Namely, the oxygen supply layer 35 is interposed between the upper surface of the second insulation layer 37 and the lower surface of the ion conducting layer 33. Note that, although the ion conducting layer 33 is disposed in the opening 38 of the second insulation layer 37, the oxygen supply layer 35 is not disposed thereat.

The oxygen supply layer 35 has the role of supplying oxygen at the time of forming the opening 38. The oxygen supply layer 35 may also serve as a hard mask at the time of forming the opening 38. The oxygen supply layer 35 may be completely removed at the time of etching the second electrode 32, but may remain on the upper surface of the second insulation layer 37.

Figure 11:
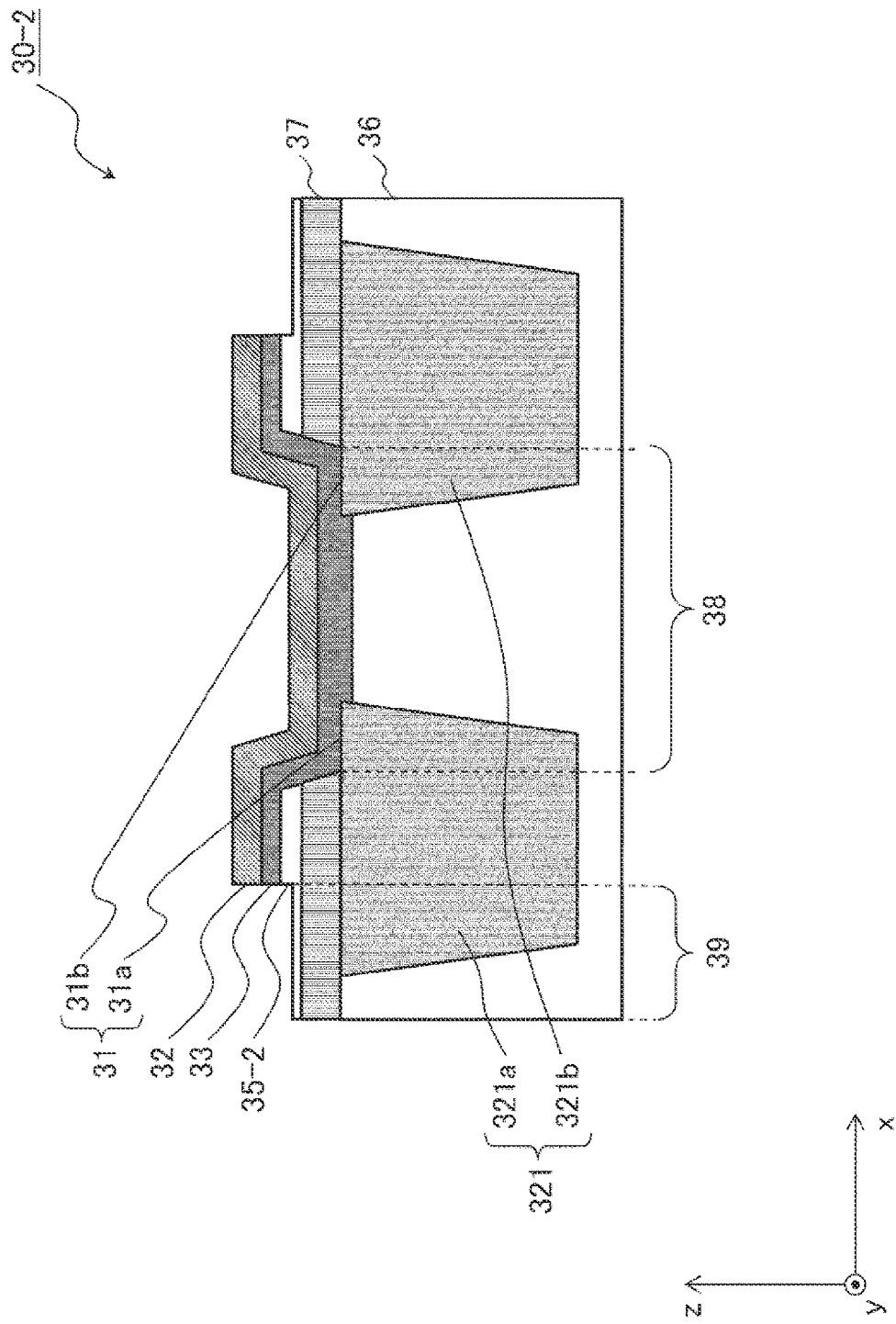
FIG. 11 is a schematic drawing showing another example of the structure of the switching element relating to the third embodiment of the present invention.

Further, as in switching element 30-2 in FIG. 11, an oxygen supply layer 35-2 that is extended at regions below 39 the sides of the end portions of the ion conducting layer 33 may be used. In a case in which the oxygen supply layer 35-2 is extended at the region below 39 the side of the end portion of the ion conducting layer 33, the film thickness of the oxygen supply layer 35-2 that is extended at the region below 39 is smaller than the film thickness of the oxygen supply layer 35-2 that is interposed between the ion conducting layer 33 and the second insulation layer 37. Further, if the oxygen supply layer 35-2 is extended, because the ion conducting layer 33 and the oxygen supply layer 35-2 are both oxides, the adhesion between the ion conducting layer 33 and the oxygen supply layer 35-2 is higher than between the ion conducting layer 33 and the second insulation layer 37.

Control of the on/off of the switching element 30 can be carried out by applying voltage or causing current to flow. For example, control of the on/off can be caried out by utilizing the phenomenon that metal ions, which are supplied from the contained in the first electrode 31, electrodiffuse into the interior of the ion conducting layer 33. When there is metal crosslinking between the first electrode 31 and the second electrode 32, the switching element 30 transitions to a low resistance state (also called the on state). Further, when the metal crosslinking between the first electrode 31 and the second electrode 32 is cut-off, the switching element 30 transitions to a high resistance state (also called the off state).

The first insulation layer 36 is an insulating film that is formed on the substrate. A wiring groove for embedding the first wire 321 is formed in the first insulation layer 36. The first wire 321 that is the main body of the first electrode 31 is embedded in the wiring groove formed in the first insulation layer 36. The first insulation layer 36 may be a structure in which plural insulation layers are layered. For example, a silicon oxide film (SiO film) or a carbon-doped silicon oxide film (SiOC film) or the like can be used at the first insulation layer 36.

The second insulation layer 37 is formed on the first electrode 31 and the first insulation layer 36. The second insulation layer 37 prevents oxidation of the metal that structures the first electrode 31, and prevents diffusion of the metal that structures the first electrode 31 into the interior of the first insulation layer 36. Further, the second insulation layer 37 functions as an etching stop layer at the time of processing the second electrode 32 and the ion conducting layer 33. For example, a silicon carbide film, a silicon carbonitride film, silicon nitride film, or layered structures thereof or the like can be used at the second insulation layer 37.

The above has been a description of an example of the structure of the switching element 30. Note that the shape and the structure of the switching element 30 that are shown in FIG. 10 are examples, and various modifications and additions can be carried out.

As described above, the switching element of the present embodiment is a three-terminal type switching element having the first electrode, the second electrode, the ion conducting layer, the first insulation layer, the second insulation layer and the oxygen supply layer. The basic structure of the present embodiment is as follows.

Namely, the first insulation layer is an insulation layer at which the first wire whose main component is copper is embedded in the first wiring groove that opens upward. The second insulation layer is an insulation layer that is formed on the upper surfaces of the first insulation layer and the first wire, an in which is formed the opening that extends to the first insulation layer and the first wire. The first electrode is the portion of the first wire which portion is exposed from the opening. The oxygen supply layer is formed on the upper surface of the second insulation layer, and generates oxygen plasma at the time of the etching that forms the opening in the second insulation layer, and that remains at, of the upper surface of the second insulation layer, at least the periphery of the opening. The ion conducting layer is an insulation layer that is formed on the upper surfaces of the first insulation layer and the first electrode that are exposed from the opening, and on the inner side surfaces of the opening of the second insulation layer, and on the upper surface of the oxygen supply layer. The second electrode is formed on the upper surface of the ion conducting layer.

In one aspect of the present embodiment, the oxygen supply layer extends at regions below the sides of the end portions of the ion conducting layer. In a case in which the oxygen supply layer extends at the regions below the sides of the end portions of the ion conducting layer, the portion that is at the region below the ion conducting layer is thicker than the portions that extend at the regions below the sides of the end portions of the ion conducting layer.

In one aspect of the present embodiment, the oxygen supply layer is structured by a material that contains silicon. For example, the oxygen supply layer is structured by at least one layer than contains at least any of silicon monoxide, silicon dioxide, carbon-doped silicon oxide, oxygen-doped silicon carbide, and low dielectric constant carbon-doped silicon oxide.

For example, the second insulation layer is structured by at least one layer that contains at least any of silicon carbide, silicon carbonitride and silicon nitride.

In the method of manufacturing a switching element of the present embodiment, at the time of forming the opening in the barrier insulation layer and exposing the copper wire, the insulating film, which contains at least oxygen and silicon and is formed on the upper surface of the barrier insulation layer, is etched without introducing oxygen gas, and low-energy oxygen plasma is generated. The oxygen plasma that is generated at this time removes the residue that remains on the upper surface of the copper wire. Because the oxygen plasma must be continued to be supplied until the copper wire is exposed, the insulating film that contains at least oxygen and silicon remains until after the copper wire is exposed.

In accordance with the present embodiment, digging-in of the edges of the copper wire is suppressed, and the places where the barrier metal of the copper wire and the ion conducting layer are near to one another are reduced. Therefore, concentrating of electric fields between the ion conducting layer and the barrier metal is mitigated. As a result, at the switching element of the present embodiment, the dielectric breakdown voltage is high, and the switching voltage is low. Namely, in accordance with the present embodiment, a switching element that is highly reliable and whose consumed electric power is low can be manufactured at a high yield.

Further, in the switching element of the present embodiment, because oxidation of the copper wire surface is suppressed, the switching voltage is low, and the leakage current is low. Therefore, in accordance with the present embodiment, a switching element that is highly reliable and whose consumed electric power is low can be produced at a high yield.

Namely, in accordance with the present embodiment, there can be provided a three-terminal type switching element at which switching voltage and leakage current are reduced, and that is highly reliable and whose consumed electric power is low.

Fourth Embodiment

A switching element relating to a fourth embodiment of the present invention is described next with reference to the drawings. The switching element of the present embodiment relates to the two-terminal type switching element 20 that is included in the semiconductor device of the second embodiment.

(Structure)

Figure 12:
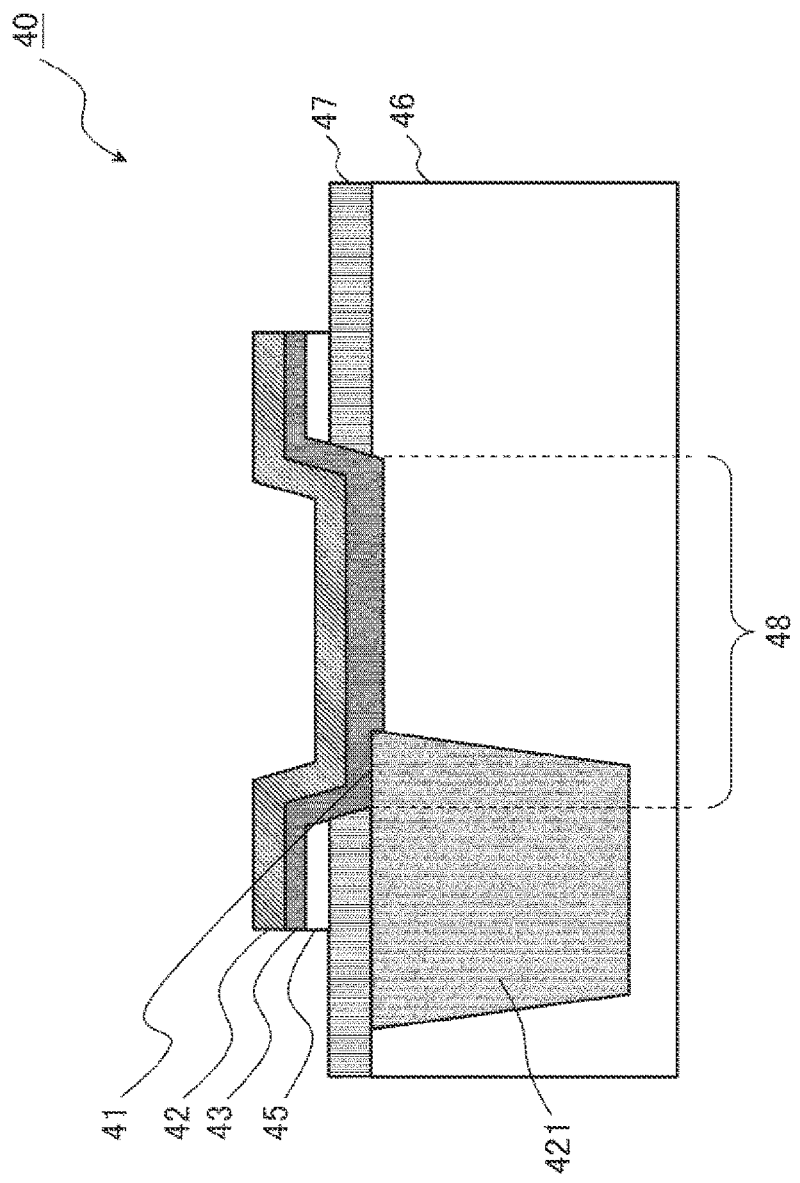
FIG. 12 is a schematic drawing showing an example of the structure of a switching element relating to a fourth embodiment of the present invention.

FIG. 12 is a cross-sectional view for explaining an example of the structure of a switching element 40 of the present embodiment. As in FIG. 12, the switching element 40 has a first electrode 41, a second electrode 42, an ion conducting layer 43, an oxygen supply layer 45, a first insulation layer 46 and a second insulation layer 47. The first electrode 41, the second electrode 42, the ion conducting layer 43 and the oxygen supply layer 45 structure the switching element 40.

The switching element 40 of FIG. 12 is a two-terminal type switching element (also called two-terminal switch) that includes a first variable resistance element. The first variable resistance element is structured by the first electrode 41, the ion conducting layer 43 and the second electrode 42.

An opening 48 is formed in the second insulation layer 47. For example, the opening 48 is formed so as to be tapered toward the depth direction (the −Z direction). In this case, the inner side surfaces of the opening 48 that is formed in the second insulation layer 47 form tapered surfaces that are tapered toward the depth direction.

The first electrode 41 is a portion of a first wire 421 that is one layer of the multilayer wiring layer and is embedded in a wiring groove formed in the first insulation layer 46 that is layered on the substrate. The first electrode 41 is a portion of the upper surface of the first wire 421.

For example, the first electrode 41 is an active electrode. In this case, a metal that diffuses or that can conduct ions at the ion conducting layer 43 is used at the first electrode 41. A metal whose main component is copper is used at the first electrode 41. The second insulation layer 47 is layered on the upper portion of the first electrode 41. As seen from a viewpoint at the upper surface side of the substrate, the first electrode 41 is exposed at the opening 48 that is formed in the second insulation layer 47. The exposed portion of the first electrode 41 is covered by the ion conducting layer 43 at the opening 48 that is formed in the second insulation layer 47.

For example, the second electrode 42 is an inactive electrode that is layered on the ion conducting layer 43. In this case, the second electrode 42 is structured of a material that is more difficult to ionize than the metal that is contained in the first electrode 41. It is preferable to use an alloy of a metal that is difficult to diffuse or to conduct ions at the ion conducting layer 43, and a metal that has good adhesion to the metal contained in the first electrode 41, at the second electrode 42. An unillustrated insulation layer is formed above the second electrode 42, and an unillustrated via and second wire are embedded in the interior of this insulation layer. The second electrode 42 is connected to the second wire by the unillustrated via.

The ion conducting layer 43 is layered on the second insulation layer 47, and covers the first electrode 41 at the inner side of the opening 48 that is formed in the second insulation layer 47. The metal that is contained in the first electrode 41 is ionized and diffuses at the interior of the ion conducting layer 43. In other words, the ion conducting layer 43 is an ion conducting layer that can conduct ions of the metal that structures the first electrode 41. By controlling the voltage or the current that is applied between the first electrode 41 and the second electrode 42, the metal ions that have diffused into the interior of the ion conducting layer 43 can be precipitated.

The ion conducting layer 43 is a film whose electrical resistance varies. A material, whose electrical resistance varies due to action such as the diffusion of or the ion conduction of or the like of the metal ions that are generated from the metal contained in the first electrode 41, can be used at the ion conducting layer 43. In particular, a material that can conduct ions is used at the ion conducting layer 43 in a case in which the resistance state of the switching element 40 is controlled by the precipitating of metal due to reduction of the metal ions.

At the interior region of the opening 48, the ion conducting layer 43 contacts the upper surfaces of the first electrode 41 and the first insulation layer 46, and contacts the tapered surfaces formed at the first electrode 41, the first insulation layer 46 and the second insulation layer 47. Further, at the peripheral region of the opening 48, the ion conducting layer 43 contacts the upper surface of the oxygen supply layer 45.

The oxygen supply layer 45 is formed on the upper surface of the second insulation layer 47. The opening 48 is formed in the oxygen supply layer 45. The ion conducting layer 43 is formed on the upper surface of the oxygen supply layer 45 and on the inner side surfaces of the opening 48. Namely, the oxygen supply layer 45 is interposed between the upper surface of the second insulation layer 47 and the lower surface of the ion conducting layer 43. Note that, although the ion conducting layer 43 is disposed in the opening 48 of the second insulation layer 47, the oxygen supply layer 45 is not disposed thereat.

The oxygen supply layer 45 has the role of supplying oxygen at the time of forming the opening 48. The oxygen supply layer 45 may also serve as a hard mask at the time of forming the opening 48. The oxygen supply layer 45 may be completely removed at the time of etching the second electrode 42, but may remain on the upper surface of the second insulation layer 47.

Figure 13:
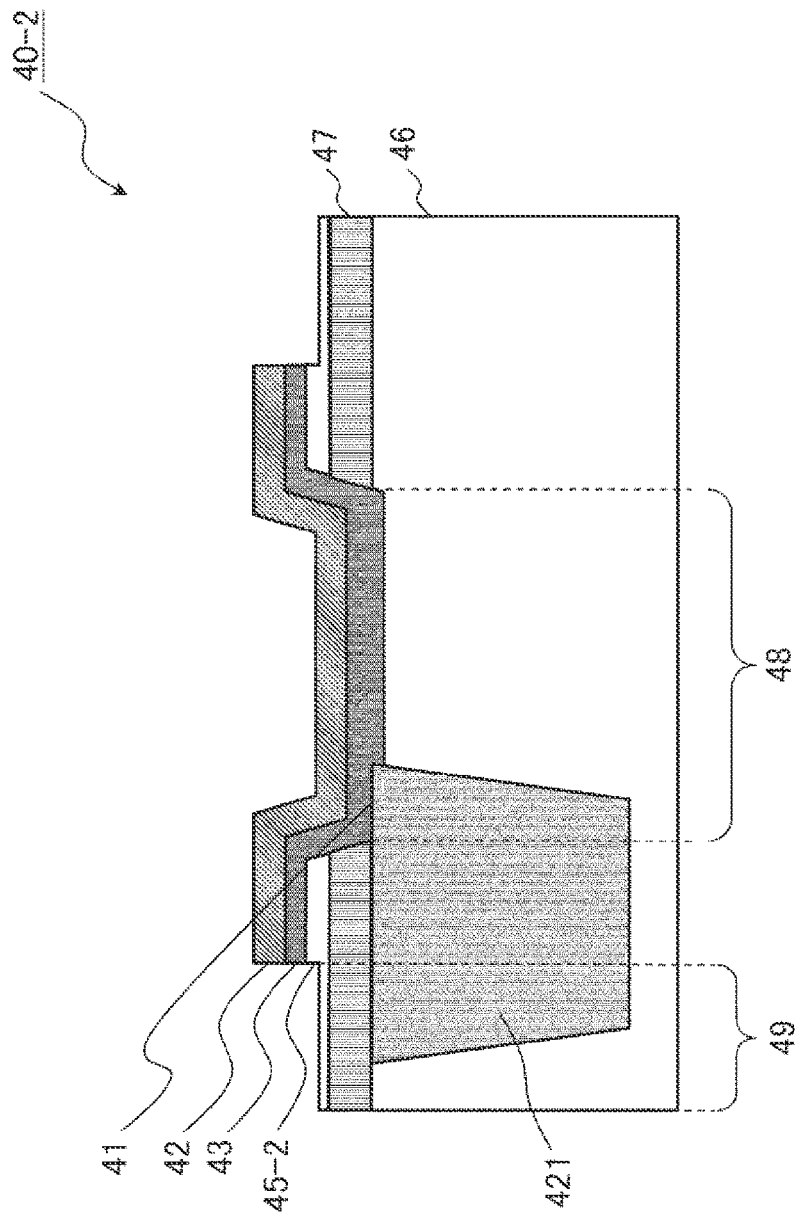
FIG. 13 is a schematic drawing showing another example of the structure of the switching element relating to the fourth embodiment of the present invention.

Further, as in switching element 40-2 in FIG. 13, an oxygen supply layer 45-2 that is extended at regions below 49 the sides of the end portions of the ion conducting layer 43 may be used. In a case in which the oxygen supply layer 45-2 is extended at the region below 49 the side of the end portion of the ion conducting layer 43, the film thickness of the oxygen supply layer 45-2 that is extended at the region below 49 is smaller than the film thickness of the oxygen supply layer 45-2 that is interposed between the ion conducting layer 43 and the second insulation layer 47. Further, if the oxygen supply layer 45-2 is extended onto the region below 49, because the ion conducting layer 43 and the oxygen supply layer 45-2 are both oxides, the adhesion between the ion conducting aver 43 and the oxygen supply layer 45-2 is higher than between the ion conducting layer 43 and the second insulation layer 47.

Control of the on/off of the switching element 40 can be carried out by applying voltage or causing current to flow. For example, control of the on/off can be carried out by utilizing the phenomenon that metal ions, which are supplied from the metal contained in the first electrode 41, electrodiffuse into the interior of the ion conducting layer 43. When there is metal crosslinking between the first electrode 41 and the second electrode 42, the switching element 40 transitions to a low resistance state (also called the on state). Further, when the metal crosslinking between the first electrode 41 and the second electrode 42 is cut-off, the switching element 40 transitions to a high resistance state (also called the off state).

The first insulation layer 46 is an insulating film that is formed on the substrate. A wiring groove for embedding the first wire 421 is formed in the first insulation layer 46. The first wire 421 that is the main body of the first electrode 41 is embedded in the wiring groove formed in the first insulation layer 46. The first insulation layer 46 may be a structure in which plural insulation layers are layered. For example, a silicon oxide film (SiO film) or a carbon-doped silicon oxide film (SiOC film) or the like can be used at the first insulation layer 46.

The second insulation layer 47 is formed on the first electrode 41 and the first insulation layer 46. The second insulation layer 47 prevents oxidation of the metal that structures the first electrode 41, and prevents diffusion of the metal that structures the first electrode 41 into the interior of the first insulation layer 46. Further, the second insulation layer 47 functions as an etching stop layer at the time of processing the second electrode 42 and the ion conducting layer 43. For example, a silicon carbide film, a silicon carbonitride film, a silicon nitride film, or layered structures thereof or the like can be used at the second insulation layer 47.

The above has been a description of an example of the structure of the switching element 40 of the present embodiment. Note that the shape and the structure of the switching element 40 that are shown in FIG. 12 are examples, and various modifications and additions can be carried out.

As described above, the switching element of the present embodiment is a two-terminal type switching element having the first electrode, the second electrode, the ion conducting layer, the first insulation layer, the second insulation layer and the oxygen supply layer. The basic structure of the present embodiment is as follows.

Namely, the first insulation layer is an insulation layer at which the first wire whose main component is copper is embedded in the first wiring groove that opens upward. The second insulation layer is an insulation layer that is formed on the upper surfaces of the first insulation layer and the first wire, an in which is formed the opening that extends to the first insulation layer and the first wire. The first electrode is the portion of the first wire which portion is exposed from the opening. The oxygen supply layer is formed on the upper surface of the second insulation layer, and generates oxygen plasma at the time of the etching that forms the opening in the second insulation layer, and that remains at, of the upper surface of the second insulation layer, at least the periphery of the opening. The ion conducting layer is an insulation layer that is formed on the upper surfaces of the first insulation layer and the first electrode that are exposed from the opening, and on the inner side surfaces of the opening of the second insulation layer, and on the upper surface of the oxygen supply layer. The second electrode is formed on the upper surface of the ion conducting layer.

In the method of manufacturing the switching element of the present embodiment, at the time of forming the opening in the barrier insulation layer and exposing the copper wire, the insulating film, which contains at least oxygen and silicon and is formed on the upper surface of the barrier insulation layer, is etched without introducing oxygen gas, and low-energy oxygen plasma is generated. The oxygen plasma that is generated at this time removes the residue that remains on the upper surface of the copper wire. Because the oxygen plasma must be continued to be supplied until the copper wire is exposed, the insulating film that contains at least oxygen and silicon remains up until after the copper wire is exposed.

In accordance with the present embodiment, digging-in of the edges of the copper wire is suppressed, and the places where the barrier metal of the copper wire and the ion conducting layer are near to one another are reduced. Therefore, the concentrating of electric fields between the ion conducting layer and the barrier metal is mitigated. As a result, at the switching element of the present embodiment, the dielectric breakdown voltage is high, and the switching voltage is low. Namely, in accordance with the present embodiment, a switching element that is highly reliable and whose consumed electric power is low can be manufactured at a high yield.

Further, in the switching element of the present embodiment, because oxidation of the copper wire surface is suppressed, the switching voltage is low, and the leakage current is low. Therefore, in accordance with the present embodiment, a switching element that is highly reliable and whose consumed electric power is low can be provided at a high yield.

Namely, in accordance with the present embodiment, there can be provided a two-terminal type switching element at which switching voltage and leakage current are reduced, and that is highly reliable and whose consumed electric power is low.

The switching elements relating to the first through fourth embodiments can be utilized as non-volatile switching elements. In particular, the switching elements relating to the first through fourth embodiments can be suitably utilized as non-volatile switching elements that structure electronic devices such as programmable logics, memories, and the like.

Although the present invention has been described above with reference to embodiments, the present invention is not limited to the above-described embodiments. Various changes that can be understood by a person skilled in the art can be made to the structures and details of the present invention within the scope of the present invention.

This application claims priority on the basis of Japanese Patent Application No. 2019-001355 that was filed on Jan. 8, 2019, and the entire disclosure thereof is incorporated herein.

EXPLANATION OF REFERENCE NUMERALS 1, 2 semiconductor device
10, 20, 30, 40 switching element
11, 21 insulating layered body
12, 22 multilayer wiring layer
31, 41 first electrode
32, 42 second electrode
33, 43 ion conducting layer
35, 45 oxygen supply layer
36, 46 first insulation layer
37, 47 second insulation layer
101, 201 first electrode
102, 202 second electrode
102a, 202a lower second electrode
102b, 202b upper second electrode
103, 203 ion conducting layer
103a, 203a first ion conducting layer
103b, 203b second ion conducting layer
104, 204 hard mask layer
104a, 204a first hard mask layer
104b, 204b second hard mask layer
105, 205 oxygen supply layer
111, 211 interlayer insulation layer
112, 212 Low-k layer
113, 213 interlayer insulation layer
114, 214 barrier insulation layer
115, 215 protecting insulation layer
116, 216 interlayer insulation layer
117, 217 Low-k layer
118, 218 interlayer insulation layer
119, 219 barrier insulation layer
121a, 121b, 121c, 221a, 221c first wire
122a, 122b, 122c, 222a, 222c first barrier metal
123a, 123b, 223a, 223b second barrier metal
124a, 124b, 224a, 224b second wire
125a, 125b, 225a, 225b via
321, 421 first wire

The invention claimed is:

1. A switching element comprising:
a first insulation layer at which a first wire, that has copper as a main component, is embedded in a first wiring groove that opens upward;
a second insulation layer that is formed at upper surfaces of the first insulation layer and the first wire, and in which is formed an opening that extends to the first insulation layer and the first wire;
a first electrode that is a portion, which is exposed from the opening, of the first wire;
an oxygen supply layer that is formed at an upper surface of the second insulation layer, that generates oxygen plasma at a time of etching that forms the opening in the second insulation layer, and that remains at, of the upper surface of the second insulation layer, at least a periphery of the opening;
an ion conducting layer that is formed at upper surfaces of the first insulation layer and the first electrode which are exposed from the opening, and at inner side surfaces of the opening of the second insulation layer, and at an upper surface of the oxygen supply layer; and
a second electrode that is formed at an upper surface of the ion conducting layer;
wherein the oxygen supply layer extends at regions below sides of end portions of the ion conducting layer, and
wherein a portion, which is at a region below the ion conducting layer, of the oxygen supply layer is thicker than portions, which extend at the regions below the sides of the end portions of the ion conducting layer, of the oxygen supply layer.

2. The switching element of claim 1, wherein the oxygen supply layer is structured by a material that contains silicon.

3. The switching element of claim 1, wherein the oxygen supply layer is structured by at least one layer that contains at least one of silicon monoxide, silicon dioxide, carbon-doped silicon oxide, oxygen-doped silicon carbide, or low dielectric constant carbon-doped silicon oxide.

4. The switching element of claim 1, wherein the second insulation layer is structured by at least one layer that contains at least one of silicon carbide, silicon carbonitride, or silicon nitride.

5. The switching element of claim 1, wherein the ion conducting layer has:
a first ion conducting layer that is formed at the upper surfaces of the first insulation layer and the first electrode which are exposed from the opening, and at the inner side surfaces of the opening of the second insulation layer, and at the upper surface of the oxygen supply layer, and that is structured by a material that has a metal oxide as a main component, and
a second ion conducting layer that is formed at an upper surface of the first ion conducting layer, and that is structured by a material that contains at least silicon, oxygen and carbon.

6. A semiconductor device comprising:
the switching element of claim 1;
a substrate, the first insulation layer being formed at an upper surface of the substrate;
a protecting insulation layer that covers regions above the switching element and the second insulation layer;
a third insulation layer that is formed above the protecting insulation layer, and in which is formed a second wiring groove, in which a second wire that is electrically connected to the second electrode, is embedded;
a fourth insulation layer that covers upper surfaces of the third insulation layer and the second wire; and
a multilayer wiring layer that has at least the first wire and the second wire, wherein:

the switching element further has:

a hard mask layer that is at least one layer and is formed at the upper surface of the ion conducting layer and through which the second wiring groove passes;

the first insulation layer has:

a first interlayer insulation layer that is formed at the upper surface of the substrate, a first low dielectric constant interlayer insulation layer that is formed at an upper surface of the first interlayer insulation layer and through which the first wiring groove passes, and a second interlayer insulation layer that is formed at an upper surface of the first low dielectric constant interlayer insulation layer and through which the first wiring groove passes;

the third insulation layer has:

a third interlayer insulation layer that is formed at an upper surface of the protecting insulation layer and through which the second wiring groove passes, a second low dielectric constant interlayer insulation layer that is formed at an upper surface of the third interlayer insulation layer and through which the second wiring groove passes, and a fourth interlayer insulation layer that is formed at an upper surface of the second low dielectric constant interlayer insulation layer and through which the second wiring groove passes; and the multilayer wiring layer further has:

a via that electrically connects the second wire and the second electrode, a first barrier metal that covers inner surfaces of the first wiring groove, the first wire being embedded at an inner side of the first barrier material, and a second barrier metal that covers inner surfaces of the second wiring groove, the via being embedded at an inner side lower portion of the second barrier metal, and the second wire being embedded at an inner side upper portion of the second barrier metal.

* * * * *